United States Patent
Hu et al.

(10) Patent No.: US 10,509,872 B2
(45) Date of Patent: Dec. 17, 2019

(54) LOCATION SELECTION FOR TREATMENT SAMPLING

(71) Applicant: THE CLIMATE CORPORATION, San Francisco, CA (US)

(72) Inventors: Jie Hu, San Francisco, CA (US); Moslem Ladoni, San Francisco, CA (US)

(73) Assignee: THE CLIMATE CORPORATION, San Francisco, CA (US)

( * ) Notice: Subject to any disclaimer, the term of this patent is extended or adjusted under 35 U.S.C. 154(b) by 147 days.

(21) Appl. No.: 15/713,507

(22) Filed: Sep. 22, 2017

(65) Prior Publication Data
US 2018/0259674 A1 Sep. 13, 2018

Related U.S. Application Data

(60) Provisional application No. 62/468,896, filed on Mar. 8, 2017.

(51) Int. Cl.
*G06F 17/50* (2006.01)
*G01V 11/00* (2006.01)
(Continued)

(52) U.S. Cl.
CPC ........ *G06F 17/5009* (2013.01); *G01V 11/002* (2013.01); *G06N 5/04* (2013.01); *A01B 79/005* (2013.01)

(58) Field of Classification Search
CPC .................................................. G06F 17/5009
See application file for complete search history.

(56) References Cited

U.S. PATENT DOCUMENTS 9,213,905 B2 * 12/2015 Lange ................ G06K 9/00805
2012/0101634 A1 * 4/2012 Lindores .............. A01B 79/005
700/266
(Continued)

FOREIGN PATENT DOCUMENTS

DK     176273 B1    5/2007

OTHER PUBLICATIONS

International Searching Authority, "Search Report" in application No. PCT/US18/21180, dated May 8, 2018, 7 pages.
(Continued)

*Primary Examiner* — Manuel L Barbee
*Assistant Examiner* — Raymond L Nimox
(74) *Attorney, Agent, or Firm* — Hickman Palermo Becker Bingham LLP

(57) ABSTRACT

In an embodiment, a computer-implemented method of selecting locations in a field for treatment sampling is disclosed. The method comprises receiving, by a processor, input data including a number T of treatments applied to a field, a number L of treatment locations for each treatment, a list of treatment polygons within the field, and a map for the field indicating one or more values of a set of design parameters corresponding to environment factors for each of a plurality of locations in the field. The method also comprises computing, by the processor, an environment class index for each of a group of locations in the list of treatment polygons based on the map; distributing the list of treatment polygons to the T treatments based on the computed indices; and selecting, for each of the T of treatments, L treatment locations from the group of locations in the treatment polygons distributed to the treatment. In addition, the method comprises causing display of information regarding the selected treatment locations.

20 Claims, 11 Drawing Sheets

(51) Int. Cl.
*G06N 5/04* (2006.01)
*A01B 79/00* (2006.01)

(56) References Cited

U.S. PATENT DOCUMENTS

| | | | |
|---|---|---|---|
| 2012/0109614 A1* | 5/2012 | Lindores | A01B 79/005 |
| | | | 703/11 |
| 2014/0012732 A1* | 1/2014 | Lindores | A01B 79/005 |
| | | | 705/37 |
| 2016/0125331 A1* | 5/2016 | Vollmar | G06Q 10/06311 |
| | | | 705/7.13 |
| 2016/0180473 A1 | 6/2016 | Groeneveld | |
| 2016/0232621 A1 | 8/2016 | Ethington et al. | |
| 2016/0247082 A1* | 8/2016 | Stehling | A01G 22/00 |
| 2016/0308954 A1* | 10/2016 | Wilbur | G06F 16/29 |
| 2017/0041407 A1* | 2/2017 | Wilbur | H04L 67/18 |

OTHER PUBLICATIONS

Current Claims in application No. PCT/US18/21180, dated May 2018, 4 pages.

\* cited by examiner

Fig. 2
(a)
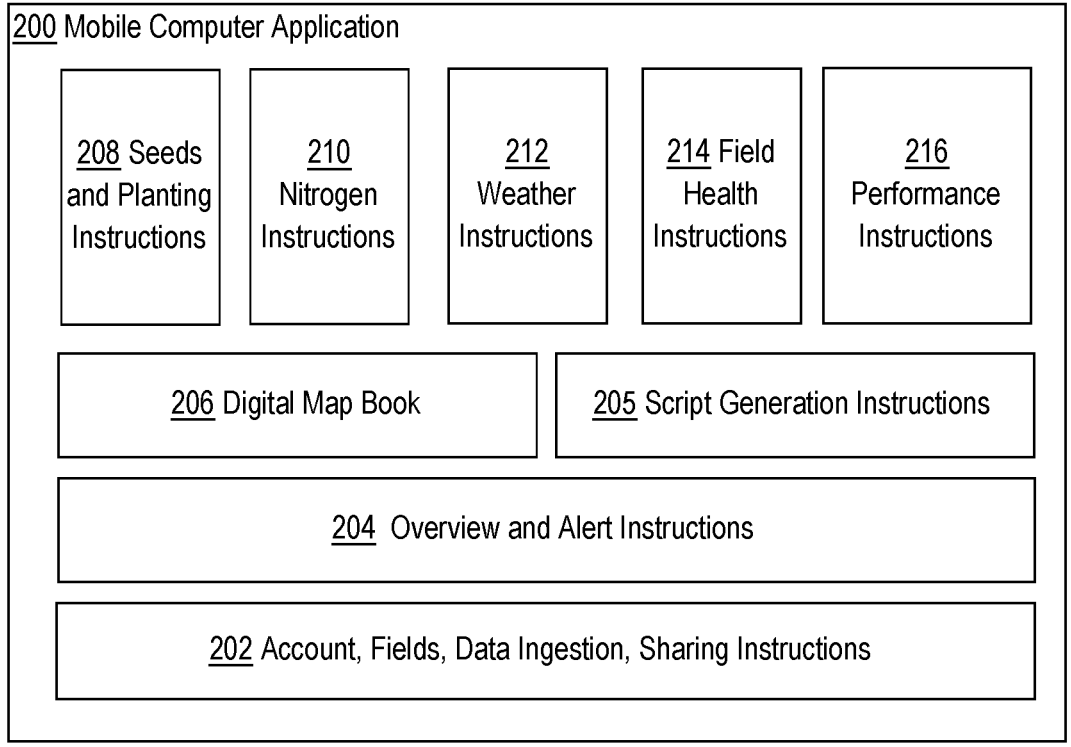
(b)
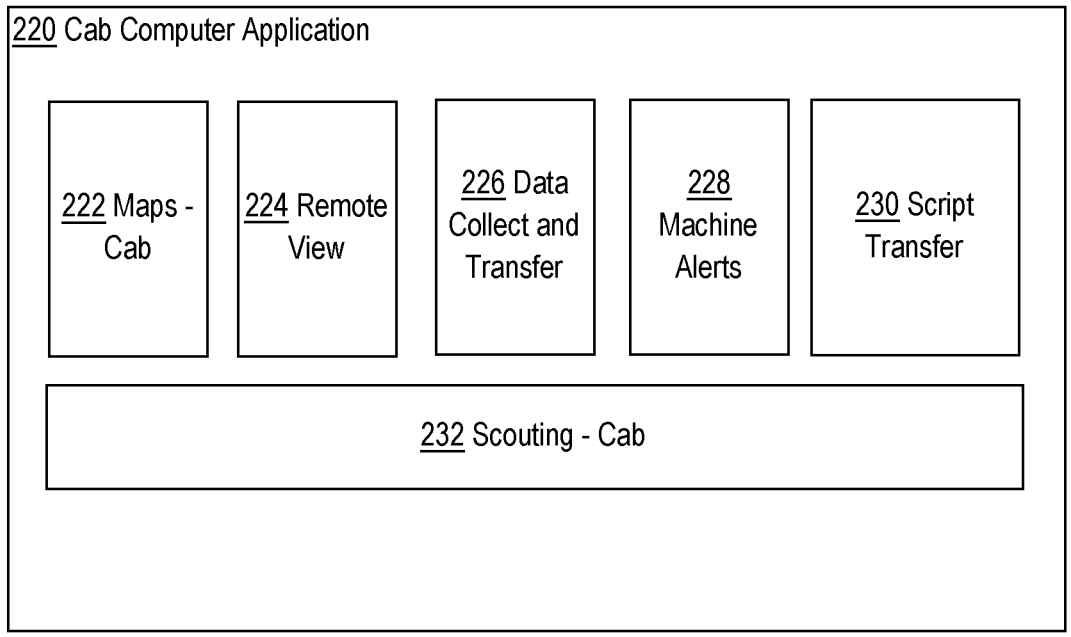

Data Manager

Nitrogen | Planting | Practices | Soil

Planting 1(4 Fields)
Crop Corn Product
Plant Date: 2016-04-12
ILU 112 | Pop: 34000
[Edit] [Apply]

Planting 2(0 Fields)
Crop Corn Product
Plant Date: 2016-04-15
ILU 83 | Pop: 34000
[Edit] [Apply]

Planting 3(0 Fields)
Crop Corn Product
Plant Date: 2016-04-13
ILU 83 | Pop: 34000
[Edit] [Apply]

Planting 4(1 Fields)
Crop Corn Product
Plant Date: 2016-04-13
ILU 112 | Pop: 34000
[Edit] [Apply]

[+ Add New Planting Plan]

| | CROP | PLANTED ACRES | PRODUCT | RELATIVE MATURITY | TARGET YIELD | POPULATION(AVG) | PLA |
|---|---|---|---|---|---|---|---|
| ☐ Select All | | | | | | | |
| ☐ Ames, IA 1 Corn \| 100 \| Boone, IA | Corn | — | DMC82-M | 112 | 160 | 34000 | Apr |
| ☑ Austin, MN 1 Corn \| 100 \| Fredricks, MN | Corn | — | DMC82-M | 114 | 160 | 36000 | Apr |
| ☐ Boone, IN 1 Corn \| 100 \| Boone, IA | Corn | — | DMC82-M | 112 | 150 | 34000 | Apr |
| ☐ Champaign 1 Corn \| 100 \| Champaign, IL | Corn | — | — | 112 | 200 | 34000 | Apr |
| ☐ E Nebraska 1 Corn \| 100 \| Burt, NE | Corn | — | — | 112 | 160 | 34000 | Apr |

| Trt Aissgnment | Trt 1 | Trt 2 | Trt 3 | Trt 4 | Mean | Variance |
|---|---|---|---|---|---|---|
| TCCDesign | 42 | 41 | 40 | 41 | 41 | 0.7 |
| Random (one realization) | 38 | 27 | 27 | 41 | 33 | 54 |
| Random (100 realizations) | 22-45 | 25-45 | 25-44 | 25-43 | 30-38 | 1.6-84 |

LOCATION SELECTION FOR TREATMENT SAMPLING

RELATED APPLICATION

This application claims the benefit under 35 U.S.C. § 119(e) of provisional application 62/468,896, filed Mar. 8, 2017, the entire contents of which is hereby incorporated by reference for all purposes as if fully set forth herein.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright or rights whatsoever. ©2017 The Climate Corporation.

FIELD OF THE DISCLOSURE

The present disclosure relates to agricultural sampling and more specifically to selection of sampling locations to increase coverage of the parameter space for agricultural treatments.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

Application of an agricultural treatment to a farm or a crop field, such as a soil fertilizer, can reveal the relationship between agricultural inputs and crop growth. Specifically, the effect of an agricultural treatment on crops is related to a variety of environmental factors, such as soil properties and topography. However, application of an agricultural treatment and the associated study of the interactions between agricultural treatments and environmental conditions may require a substantial investment of time, labor, or money. Thus, it is sometimes necessary to sample the effect of an agricultural treatment on select locations within a farm or a crop field due to limited resources. Given the generally large size of a crop field and the large number of environment factors affecting an agricultural treatment, it could be helpful to identify appropriate sampling locations for selected application of an agricultural treatment.

SUMMARY

The appended claims may serve as a summary of the disclosure.

BRIEF DESCRIPTION OF THE DRAWINGS

In the drawings:

FIG. 2 illustrates two views of an example logical organization of sets of instructions in main memory when an example mobile application is loaded for execution.

FIG. 6 depicts an example embodiment of a spreadsheet view for data entry.

FIG. 9 illustrates an example comparison in treatment assignment between output of the treatment sampling server and output of a random assignment technique.

DETAILED DESCRIPTION

Figure 1:
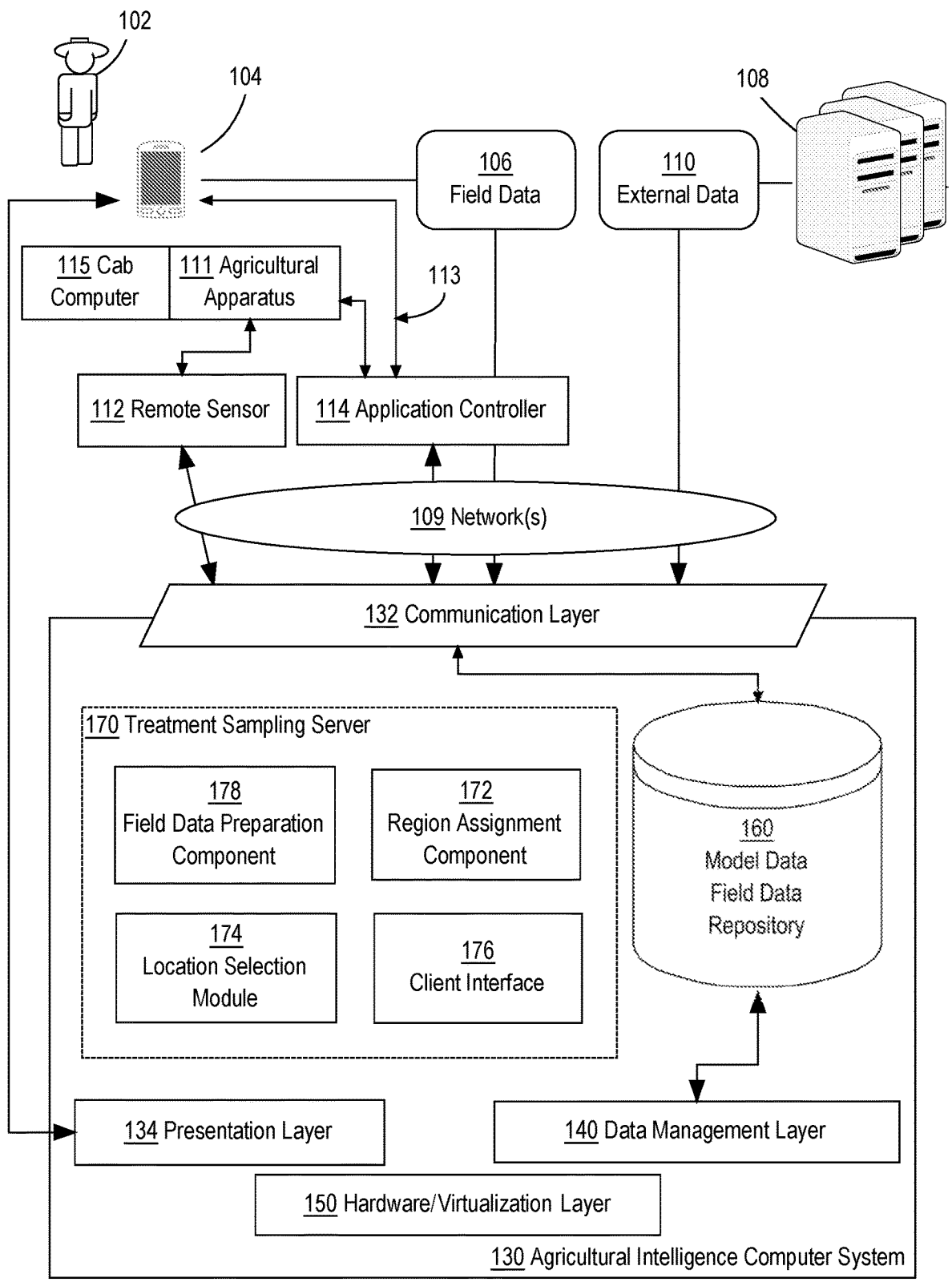
FIG. 1 illustrates an example computer system that is configured to perform the functions described herein, shown in a field environment with other apparatus with which the system may interoperate.

In the following description, for the purposes of explanation, numerous specific details are set forth in order to provide a thorough understanding of the present disclosure. It will be apparent, however, that embodiments may be practiced without these specific details. In other instances, well-known structures and devices are shown in block diagram form in order to avoid unnecessarily obscuring the present disclosure. Embodiments are disclosed in sections according to the following outline:

1. GENERAL OVERVIEW
2. EXAMPLE AGRICULTURAL INTELLIGENCE COMPUTER SYSTEM
   2.1. STRUCTURAL OVERVIEW
   2.2. APPLICATION PROGRAM OVERVIEW
   2.3. DATA INGEST TO THE COMPUTER SYSTEM
   2.4 PROCESS OVERVIEW—AGRONOMIC MODEL TRAINING
   2.5 LOCATION SELECTION FOR TREATMENT SAMPLING
   2.6 IMPLEMENTATION EXAMPLE—HARDWARE OVERVIEW
3. FUNCTIONAL DESCRIPTION
   3.1 GENERATING FIELD DATA
   3.2 DISTRIBUTING TREATMENT POLYGONS TO TREATMENTS
   3.3 SELECTING TREATMENT LOCATIONS WITHIN TREATMENT POLYGONS
   3.4 EXAMPLE DATA AND PROCESSES

1. General Overview

In an embodiment, a computer-implemented method of selecting locations in a field for treatment sampling is disclosed, and may be implemented in various embodiments using a server computer, server process or programs for other computers. The method comprises receiving, by a processor, input data including a number T of treatments applied to a field, a number L of treatment locations for each treatment, a list of treatment polygons within the field, and a map for the field indicating one or more values of a set of design parameters corresponding to environment factors for each of a plurality of locations in the field. The method also comprises computing, by the processor, an environment class index for each of a group of locations in the list of treatment polygons based on the map; distributing the list of treatment polygons to the T treatments based on the computed indices; and selecting, for each of the T of treatments, L treatment locations from the group of locations in the treatment polygons distributed to the treatment. In addition, the method comprises causing display of information regarding the selected treatment locations.

Embodiments provide benefits in several different contexts. For example, for purposes of developing digital computer-implemented models of agricultural processes, such as models for predicting nitrogen levels in soil, highly-controlled treatment experiments may be conducted in a field to gather sufficient data of unique treatment and environmental factors combinations. Specifically, the process of predicting nitrogen levels in the soil might involve building an initial model, performing nitrogen trials for different combinations of the soil, weather, or management conditions, running the initial model under the same conditions, comparing the model outcome to the measured outcome from the nitrogen trials to calibrate the initial model, and generating a final model to produce predictions that are closer to the measured values.

A treatment sampling method and computer system that may be programmed for selecting locations in a field for sampling treatments are disclosed. Typically, multiple treatments are to be performed in certain regions within a field, which will be referred to as treatment polygons hereinafter. For example, each treatment polygon can correspond to a smallest contiguous unit of a field that is subject to uniform, prescribed management practices. The treatment polygons may be represented and defined within a computer using stored digital datasets identifying vertices and edges that in combination, when graphically visualized, form closed polygons. Given a geographical map that indicates values of environment factors, which correspond to modeling parameters that affect the output of a model of an agricultural process, for certain locations within the treatment polygons, embodiments may be programmed to identify a distinct group of locations within the treatment polygons that would cover a wide range of modeling parameter values for each of the treatments. The modeling parameters will be referred to as design parameters hereinafter. Examples of design parameters include the level of soil organic matter ("SOM"), the soil cation exchange capacity ("CEC"), the soil pH value, or the elevation relative to a base level.

In some embodiments, a programmed computer system can first classify the soil condition in different locations of interest within the treatment polygons. Specifically, for each design parameter of interest, programmed computer system can create categories based on a global range for the design parameter and an indicator of sensitivity of the model output to unit changes in the design parameter. Then, for each location of interest, the programmed computer system can cross-classify the categories for all the design parameters and label the output as an environment class index or specifically a cross-classified strata index ("CSI"), with each stratum corresponding to a unique combination of categories respectively for the design parameters. Next, programmed computer system can distribute treatment polygons to the treatments to maximize the number of unique CSIs present under each treatment. Next, programmed computer system can select locations within the treatment polygons distributed to each treatment again to maximize the number of unique CSIs present under the treatment. Specifically, for each treatment, programmed computer system can first select a number of unique CSIs present under the treatment, which corresponds to the number of required samples, and then, for each of the selected CSI, select one location associated with the CSI.

Selecting locations for treatment sampling using these approaches has many technical benefits. First, significant exploration of the parameter space and extensive calibration of digital computer-implemented models of agricultural processes can be achieved, and thus embodiments of the technique disclosed herein contribute to modeling accuracy. Second, the approaches enable intelligent selection of sampling points for comprehensive validation of modeling results in a limited amount of time. Third, the programmed method and computer system offer flexibility in tuning output performance by accepting different weights for different design parameters as input data. Fourth, the embodiments are highly scalable as they are generally not limited by the size or scope of the input data, which can include the number of treatments of interest, the number or size of treatment polygons, or the number or complexity of design parameters.

2. Example Agricultural Intelligence Computer System 2.1 Structural Overview

FIG. 1 illustrates an example computer system that is configured to perform the functions described herein, shown in a field environment with other apparatus with which the system may interoperate. In one embodiment, a user 102 owns, operates or possesses a field manager computing device 104 in a field location or associated with a field location such as a field intended for agricultural activities or a management location for one or more agricultural fields. The field manager computer device 104 is programmed or configured to provide field data 106 to an agricultural intelligence computer system 130 via one or more networks 109.

Examples of field data 106 include (a) identification data (for example, acreage, field name, field identifiers, geographic identifiers, boundary identifiers, crop identifiers, and any other suitable data that may be used to identify farm land, such as a common land unit (CLU), lot and block number, a parcel number, geographic coordinates and boundaries, Farm Serial Number (FSN), farm number, tract number, field number, section, township, and/or range), (b) harvest data (for example, crop type, crop variety, crop rotation, whether the crop is grown organically, harvest date, Actual Production History (APH), expected yield, yield, crop price, crop revenue, grain moisture, tillage practice, and previous growing season information), (c) soil data (for example, type, composition, pH, organic matter (OM), cation exchange capacity (CEC)), (d) planting data (for example, planting date, seed(s) type, relative maturity (RM) of planted seed(s), seed population), (e) fertilizer data (for example, nutrient type (Nitrogen, Phosphorous, Potassium), application type, application date, amount, source, method), (f) pesticide data (for example, pesticide, herbicide, fungicide, other substance or mixture of substances intended for use as a plant regulator, defoliant, or desiccant, application date, amount, source, method), (g) irrigation data (for example, application date, amount, source, method), (h) weather data (for example, precipitation, rainfall rate, predicted rainfall, water runoff rate region, temperature, wind, forecast, pressure, visibility, clouds, heat index, dew point, humidity, snow depth, air quality, sunrise, sunset), (i) imagery data (for example, imagery and light spectrum information from an agricultural apparatus sensor, camera, computer, smartphone, tablet, unmanned aerial vehicle, planes or satellite), (j) scouting observations (photos, videos, free form notes, voice recordings, voice transcriptions, weather conditions (temperature, precipitation (current and over time), soil moisture, crop growth stage, wind velocity, relative humidity, dew point, black layer)), and (k) soil, seed, crop phenology, pest and disease reporting, and predictions sources and databases.

A data server computer 108 is communicatively coupled to agricultural intelligence computer system 130 and is programmed or configured to send external data 110 to agricultural intelligence computer system 130 via the network(s) 109. The external data server computer 108 may be owned or operated by the same legal person or entity as the agricultural intelligence computer system 130, or by a different person or entity such as a government agency, non-governmental organization (NGO), and/or a private data service provider. Examples of external data include weather data, imagery data, soil data, or statistical data relating to crop yields, among others. External data 110 may consist of the same type of information as field data 106. In some embodiments, the external data 110 is provided by an external data server 108 owned by the same entity that owns and/or operates the agricultural intelligence computer system 130. For example, the agricultural intelligence computer system 130 may include a data server focused exclusively on a type of data that might otherwise be obtained from third party sources, such as weather data. In some embodiments, an external data server 108 may actually be incorporated within the system 130.

An agricultural apparatus 111 may have one or more remote sensors 112 fixed thereon, which sensors are communicatively coupled either directly or indirectly via agricultural apparatus 111 to the agricultural intelligence computer system 130 and are programmed or configured to send sensor data to agricultural intelligence computer system 130. Examples of agricultural apparatus 111 include tractors, combines, harvesters, planters, trucks, fertilizer equipment, unmanned aerial vehicles, and any other item of physical machinery or hardware, typically mobile machinery, and which may be used in tasks associated with agriculture. In some embodiments, a single unit of apparatus 111 may comprise a plurality of sensors 112 that are coupled locally in a network on the apparatus; controller area network (CAN) is example of such a network that can be installed in combines or harvesters. Application controller 114 is communicatively coupled to agricultural intelligence computer system 130 via the network(s) 109 and is programmed or configured to receive one or more scripts to control an operating parameter of an agricultural vehicle or implement from the agricultural intelligence computer system 130. For instance, a controller area network (CAN) bus interface may be used to enable communications from the agricultural intelligence computer system 130 to the agricultural apparatus 111, such as how the CLIMATE FIELDVIEW DRIVE, available from The Climate Corporation, San Francisco, Calif., is used. Sensor data may consist of the same type of information as field data 106. In some embodiments, remote sensors 112 may not be fixed to an agricultural apparatus 111 but may be remotely located in the field and may communicate with network 109.

The apparatus 111 may comprise a cab computer 115 that is programmed with a cab application, which may comprise a version or variant of the mobile application for device 104 that is further described in other sections herein. In an embodiment, cab computer 115 comprises a compact computer, often a tablet-sized computer or smartphone, with a graphical screen display, such as a color display, that is mounted within an operator's cab of the apparatus 111. Cab computer 115 may implement some or all of the operations and functions that are described further herein for the mobile computer device 104.

The network(s) 109 broadly represent any combination of one or more data communication networks including local area networks, wide area networks, internetworks or internets, using any of wireline or wireless links, including terrestrial or satellite links. The network(s) may be implemented by any medium or mechanism that provides for the exchange of data between the various elements of FIG. 1. The various elements of FIG. 1 may also have direct (wired or wireless) communications links. The sensors 112, controller 114, external data server computer 108, and other elements of the system each comprise an interface compatible with the network(s) 109 and are programmed or configured to use standardized protocols for communication across the networks such as TCP/IP, Bluetooth, CAN protocol and higher-layer protocols such as HTTP, TLS, and the like.

Agricultural intelligence computer system 130 is programmed or configured to receive field data 106 from field manager computing device 104, external data 110 from external data server computer 108, and sensor data from remote sensor 112. Agricultural intelligence computer system 130 may be further configured to host, use or execute one or more computer programs, other software elements, digitally programmed logic such as FPGAs or ASICs, or any combination thereof to perform translation and storage of data values, construction of digital models of one or more crops on one or more fields, generation of recommendations and notifications, and generation and sending of scripts to application controller 114, in the manner described further in other sections of this disclosure.

In an embodiment, agricultural intelligence computer system 130 is programmed with or comprises a communication layer 132, presentation layer 134, data management layer 140, hardware/virtualization layer 150, and model and field data repository 160. "Layer," in this context, refers to any combination of electronic digital interface circuits, microcontrollers, firmware such as drivers, and/or computer programs or other software elements.

Communication layer 132 may be programmed or configured to perform input/output interfacing functions including sending requests to field manager computing device 104, external data server computer 108, and remote sensor 112 for field data, external data, and sensor data respectively. Communication layer 132 may be programmed or configured to send the received data to model and field data repository 160 to be stored as field data 106.

Presentation layer 134 may be programmed or configured to generate a graphical user interface (GUI) to be displayed on field manager computing device 104, cab computer 115 or other computers that are coupled to the system 130 through the network 109. The GUI may comprise controls for inputting data to be sent to agricultural intelligence computer system 130, generating requests for models and/or recommendations, and/or displaying recommendations, notifications, models, and other field data.

Data management layer 140 may be programmed or configured to manage read operations and write operations involving the repository 160 and other functional elements of the system, including queries and result sets communicated between the functional elements of the system and the repository. Examples of data management layer 140 include JDBC, SQL server interface code, and/or HADOOP interface code, among others. Repository 160 may comprise a database. As used herein, the term "database" may refer to either a body of data, a relational database management system (RDBMS), or to both. As used herein, a database may comprise any collection of data including hierarchical databases, relational databases, flat file databases, object-relational databases, object oriented databases, and any other structured collection of records or data that is stored in a computer system. Examples of RDBMS's include, but are not limited to including, ORACLE®, MYSQL, IBM® DB2, MICROSOFT® SQL SERVER, SYBASE®, and POSTGR-ESQL databases. However, any database may be used that enables the systems and methods described herein.

When field data 106 is not provided directly to the agricultural intelligence computer system via one or more agricultural machines or agricultural machine devices that interacts with the agricultural intelligence computer system, the user may be prompted via one or more user interfaces on the user device (served by the agricultural intelligence computer system) to input such information. In an example embodiment, the user may specify identification data by accessing a map on the user device (served by the agricultural intelligence computer system) and selecting specific CLUs that have been graphically shown on the map. In an alternative embodiment, the user 102 may specify identification data by accessing a map on the user device (served by the agricultural intelligence computer system 130) and drawing boundaries of the field over the map. Such CLU selection or map drawings represent geographic identifiers. In alternative embodiments, the user may specify identification data by accessing field identification data (provided as shape files or in a similar format) from the U. S. Department of Agriculture Farm Service Agency or other source via the user device and providing such field identification data to the agricultural intelligence computer system.

In an example embodiment, the agricultural intelligence computer system 130 is programmed to generate and cause displaying a graphical user interface comprising a data manager for data input. After one or more fields have been identified using the methods described above, the data manager may provide one or more graphical user interface widgets which when selected can identify changes to the field, soil, crops, tillage, or nutrient practices. The data manager may include a timeline view, a spreadsheet view, and/or one or more editable programs.

Figure 5:
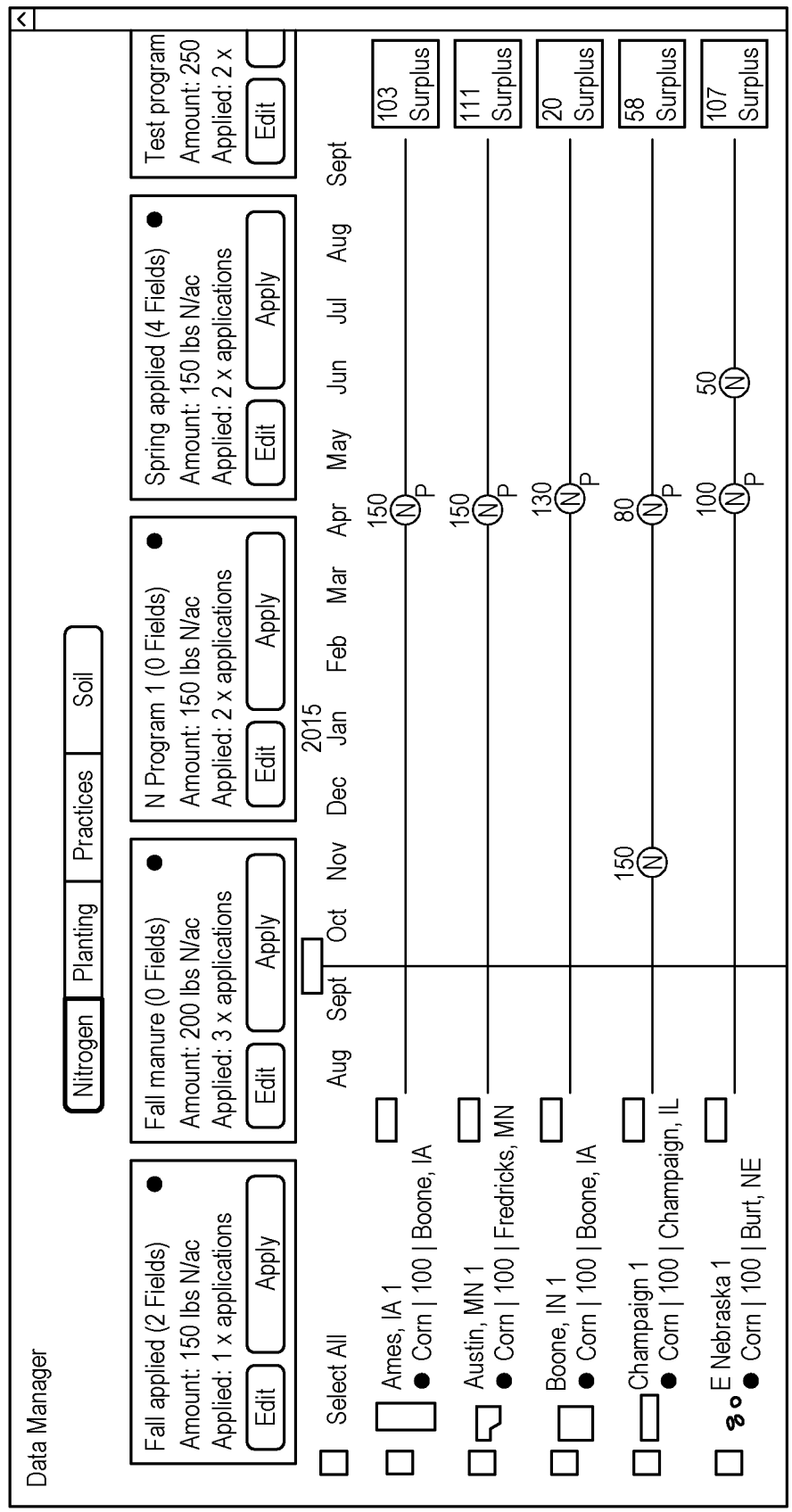
FIG. 5 depicts an example embodiment of a timeline view for data entry.

FIG. 5 depicts an example embodiment of a timeline view for data entry. Using the display depicted in FIG. 5, a user computer can input a selection of a particular field and a particular date for the addition of event. Events depicted at the top of the timeline may include Nitrogen, Planting, Practices, and Soil. To add a nitrogen application event, a user computer may provide input to select the nitrogen tab. The user computer may then select a location on the timeline for a particular field in order to indicate an application of nitrogen on the selected field. In response to receiving a selection of a location on the timeline for a particular field, the data manager may display a data entry overlay, allowing the user computer to input data pertaining to nitrogen applications, planting procedures, soil application, tillage procedures, irrigation practices, or other information relating to the particular field. For example, if a user computer selects a portion of the timeline and indicates an application of nitrogen, then the data entry overlay may include fields for inputting an amount of nitrogen applied, a date of application, a type of fertilizer used, and any other information related to the application of nitrogen.

In an embodiment, the data manager provides an interface for creating one or more programs. "Program," in this context, refers to a set of data pertaining to nitrogen applications, planting procedures, soil application, tillage procedures, irrigation practices, or other information that may be related to one or more fields, and that can be stored in digital data storage for reuse as a set in other operations. After a program has been created, it may be conceptually applied to one or more fields and references to the program may be stored in digital storage in association with data identifying the fields. Thus, instead of manually entering identical data relating to the same nitrogen applications for multiple different fields, a user computer may create a program that indicates a particular application of nitrogen and then apply the program to multiple different fields. For example, in the timeline view of FIG. 5, the top two timelines have the "Fall applied" program selected, which includes an application of 150 lbs N/ac in early April. The data manager may provide an interface for editing a program. In an embodiment, when a particular program is edited, each field that has selected the particular program is edited. For example, in FIG. 5, if the "Fall applied" program is edited to reduce the application of nitrogen to 130 lbs N/ac, the top two fields may be updated with a reduced application of nitrogen based on the edited program.

In an embodiment, in response to receiving edits to a field that has a program selected, the data manager removes the correspondence of the field to the selected program. For example, if a nitrogen application is added to the top field in FIG. 5, the interface may update to indicate that the "Fall applied" program is no longer being applied to the top field. While the nitrogen application in early April may remain, updates to the "Fall applied" program would not alter the April application of nitrogen.

FIG. 6 depicts an example embodiment of a spreadsheet view for data entry. Using the display depicted in FIG. 6, a user can create and edit information for one or more fields. The data manager may include spreadsheets for inputting information with respect to Nitrogen, Planting, Practices, and Soil as depicted in FIG. 6. To edit a particular entry, a user computer may select the particular entry in the spreadsheet and update the values. For example, FIG. 6 depicts an in-progress update to a target yield value for the second field. Additionally, a user computer may select one or more fields in order to apply one or more programs. In response to receiving a selection of a program for a particular field, the data manager may automatically complete the entries for the particular field based on the selected program. As with the timeline view, the data manager may update the entries for each field associated with a particular program in response to receiving an update to the program. Additionally, the data manager may remove the correspondence of the selected program to the field in response to receiving an edit to one of the entries for the field.

In an embodiment, model and field data is stored in model and field data repository 160. Model data comprises data models created for one or more fields. For example, a crop model may include a digitally constructed model of the development of a crop on the one or more fields. "Model," in this context, refers to an electronic digitally stored set of executable instructions and data values, associated with one another, which are capable of receiving and responding to a programmatic or other digital call, invocation, or request for resolution based upon specified input values, to yield one or more stored output values that can serve as the basis of computer-implemented recommendations, output data displays, or machine control, among other things. Persons of skill in the field find it convenient to express models using mathematical equations, but that form of expression does not confine the models disclosed herein to abstract concepts;

instead, each model herein has a practical application in a computer in the form of stored executable instructions and data that implement the model using the computer. The model may include a model of past events on the one or more fields, a model of the current status of the one or more fields, and/or a model of predicted events on the one or more fields. Model and field data may be stored in data structures in memory, rows in a database table, in flat files or spreadsheets, or other forms of stored digital data.

In some embodiments, agricultural intelligence computer system 130 is programmed with or comprises a treatment sampling server computer or process ("server") 170. In an embodiment, each component of the server 170 comprises a set of one or more pages of main memory, such as RAM, in the agricultural intelligence computer system 130 into which executable instructions have been loaded and which when executed cause the agricultural intelligence computing system to perform the functions or operations that are described herein with reference to those modules. For example, the region assignment component 172 may comprise a set of pages in RAM that contain instructions which when executed cause performing the nutrient modeling functions that are described herein. The instructions may be in machine executable code in the instruction set of a CPU and may have been compiled based upon source code written in JAVA, C, C++, OBJECTIVE-C, or any other human-readable programming language or environment, alone or in combination with scripts in JAVASCRIPT, other scripting languages and other programming source text. The term "pages" is intended to refer broadly to any region within main memory and the specific terminology used in a system may vary depending on the memory architecture or processor architecture. In another embodiment, each of the components in the server 170 also may represent one or more files or projects of source code that are digitally stored in a mass storage device such as non-volatile RAM or disk storage, in the agricultural intelligence computer system 130 or a separate repository system, which when compiled or interpreted cause generating executable instructions which when executed cause the agricultural intelligence computing system to perform the functions or operations that are described herein with reference to those modules. In other words, the drawing figure may represent the manner in which programmers or software developers organize and arrange source code for later compilation into an executable, or interpretation into bytecode or the equivalent, for execution by the agricultural intelligence computer system 130.

Figure 4:
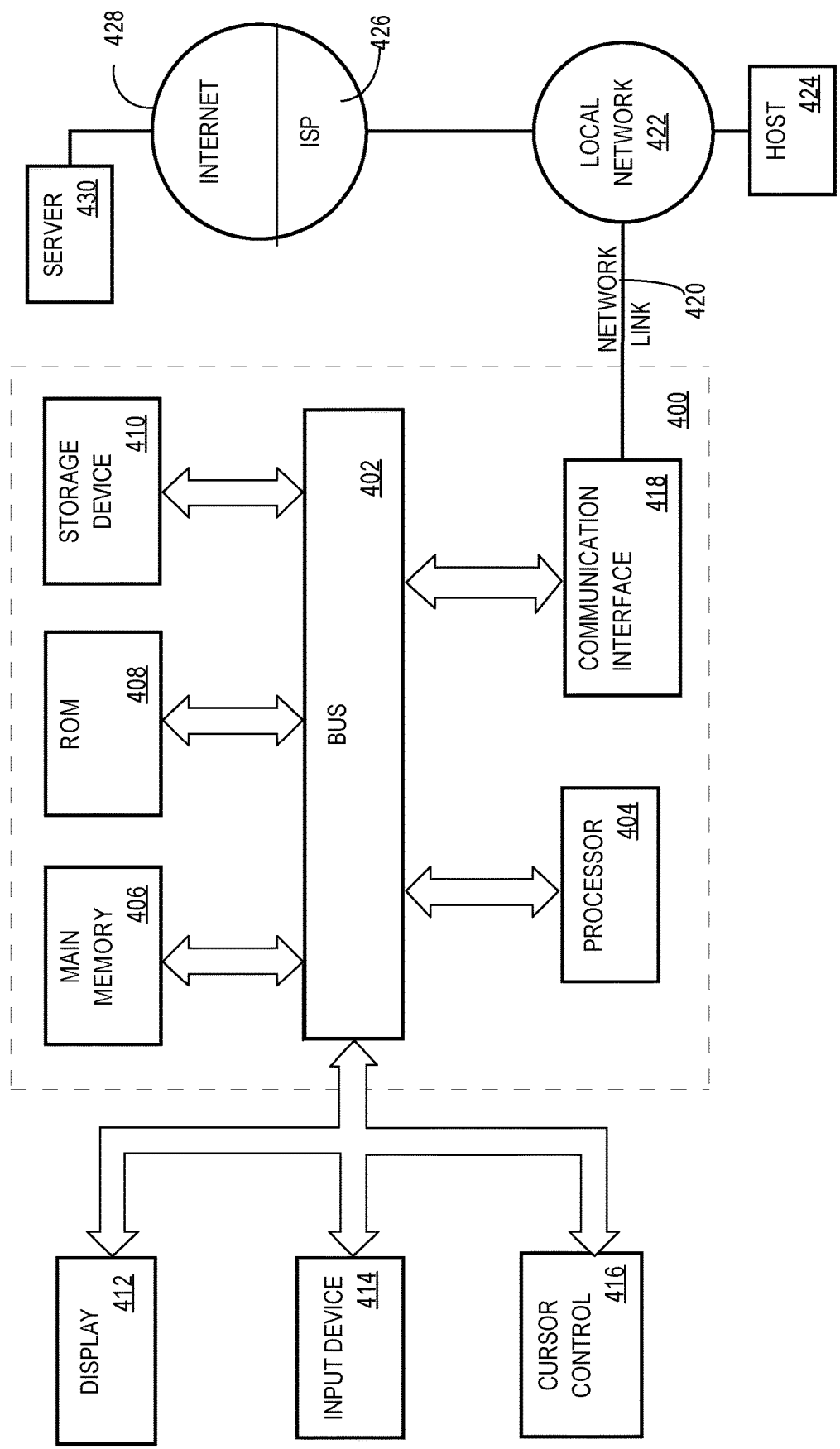
FIG. 4 is a block diagram that illustrates a computer system upon which an embodiment of the invention may be implemented.

Hardware/virtualization layer 150 comprises one or more central processing units (CPUs), memory controllers, and other devices, components, or elements of a computer system such as volatile or non-volatile memory, non-volatile storage such as disk, and I/O devices or interfaces as illustrated and described, for example, in connection with FIG. 4. The layer 150 also may comprise programmed instructions that are configured to support virtualization, containerization, or other technologies.

For purposes of illustrating a clear example, FIG. 1 shows a limited number of instances of certain functional elements. However, in other embodiments, there may be any number of such elements. For example, embodiments may use thousands or millions of different mobile computing devices 104 associated with different users. Further, the system 130 and/or external data server computer 108 may be implemented using two or more processors, cores, clusters, or instances of physical machines or virtual machines, configured in a discrete location or co-located with other elements in a datacenter, shared computing facility or cloud computing facility.

2.2. Application Program Overview

In an embodiment, the implementation of the functions described herein using one or more computer programs or other software elements that are loaded into and executed using one or more general-purpose computers will cause the general-purpose computers to be configured as a particular machine or as a computer that is specially adapted to perform the functions described herein. Further, each of the flow diagrams that are described further herein may serve, alone or in combination with the descriptions of processes and functions in prose herein, as algorithms, plans or directions that may be used to program a computer or logic to implement the functions that are described. In other words, all the prose text herein, and all the drawing figures, together are intended to provide disclosure of algorithms, plans or directions that are sufficient to permit a skilled person to program a computer to perform the functions that are described herein, in combination with the skill and knowledge of such a person given the level of skill that is appropriate for inventions and disclosures of this type.

In an embodiment, user 102 interacts with agricultural intelligence computer system 130 using field manager computing device 104 configured with an operating system and one or more application programs or apps; the field manager computing device 104 also may interoperate with the agricultural intelligence computer system independently and automatically under program control or logical control and direct user interaction is not always required. Field manager computing device 104 broadly represents one or more of a smart phone, PDA, tablet computing device, laptop computer, desktop computer, workstation, or any other computing device capable of transmitting and receiving information and performing the functions described herein. Field manager computing device 104 may communicate via a network using a mobile application stored on field manager computing device 104, and in some embodiments, the device may be coupled using a cable 113 or connector to the sensor 112 and/or controller 114. A particular user 102 may own, operate or possess and use, in connection with system 130, more than one field manager computing device 104 at a time.

The mobile application may provide client-side functionality, via the network to one or more mobile computing devices. In an example embodiment, field manager computing device 104 may access the mobile application via a web browser or a local client application or app. Field manager computing device 104 may transmit data to, and receive data from, one or more front-end servers, using web-based protocols or formats such as HTTP, XML and/or JSON, or app-specific protocols. In an example embodiment, the data may take the form of requests and user information input, such as field data, into the mobile computing device. In some embodiments, the mobile application interacts with location tracking hardware and software on field manager computing device 104 which determines the location of field manager computing device 104 using standard tracking techniques such as multilateration of radio signals, the global positioning system (GPS), WiFi positioning systems, or other methods of mobile positioning. In some cases, location data or other data associated with the device 104, user 102, and/or user account(s) may be obtained by queries to an operating system of the device or by requesting an app on the device to obtain data from the operating system.

In an embodiment, field manager computing device 104 sends field data 106 to agricultural intelligence computer system 130 comprising or including, but not limited to, data values representing one or more of: a geographical location of the one or more fields, tillage information for the one or more fields, crops planted in the one or more fields, and soil data extracted from the one or more fields. Field manager computing device 104 may send field data 106 in response to user input from user 102 specifying the data values for the one or more fields. Additionally, field manager computing device 104 may automatically send field data 106 when one or more of the data values becomes available to field manager computing device 104. For example, field manager computing device 104 may be communicatively coupled to remote sensor 112 and/or application controller 114. In response to receiving data indicating that application controller 114 released water onto the one or more fields, field manager computing device 104 may send field data 106 to agricultural intelligence computer system 130 indicating that water was released on the one or more fields. Field data 106 identified in this disclosure may be input and communicated using electronic digital data that is communicated between computing devices using parameterized URLs over HTTP, or another suitable communication or messaging protocol.

A commercial example of the mobile application is CLIMATE FIELDVIEW, commercially available from The Climate Corporation, San Francisco, Calif. The CLIMATE FIELDVIEW application, or other applications, may be modified, extended, or adapted to include features, functions, and programming that have not been disclosed earlier than the filing date of this disclosure. In one embodiment, the mobile application comprises an integrated software platform that allows a grower to make fact-based decisions for their operation because it combines historical data about the grower's fields with any other data that the grower wishes to compare. The combinations and comparisons may be performed in real time and are based upon scientific models that provide potential scenarios to permit the grower to make better, more informed decisions.

FIG. 2 illustrates two views of an example logical organization of sets of instructions in main memory when an example mobile application is loaded for execution. In FIG. 2, each named element represents a region of one or more pages of RAM or other main memory, or one or more blocks of disk storage or other non-volatile storage, and the programmed instructions within those regions. In one embodiment, in view (a), a mobile computer application 200 comprises account-fields-data ingestion-sharing instructions 202, overview and alert instructions 204, digital map book instructions 206, seeds and planting instructions 208, nitrogen instructions 210, weather instructions 212, field health instructions 214, and performance instructions 216.

In one embodiment, a mobile computer application 200 comprises account-fields-data ingestion-sharing instructions 202 which are programmed to receive, translate, and ingest field data from third party systems via manual upload or APIs. Data types may include field boundaries, yield maps, as-planted maps, soil test results, as-applied maps, and/or management zones, among others. Data formats may include shape files, native data formats of third parties, and/or farm management information system (FMIS) exports, among others. Receiving data may occur via manual upload, e-mail with attachment, external APIs that push data to the mobile application, or instructions that call APIs of external systems to pull data into the mobile application. In one embodiment, mobile computer application 200 comprises a data inbox. In response to receiving a selection of the data inbox, the mobile computer application 200 may display a graphical user interface for manually uploading data files and importing uploaded files to a data manager.

In one embodiment, digital map book instructions 206 comprise field map data layers stored in device memory and are programmed with data visualization tools and geospatial field notes. This provides growers with convenient information close at hand for reference, logging and visual insights into field performance. In one embodiment, overview and alert instructions 204 are programmed to provide an operation-wide view of what is important to the grower, and timely recommendations to take action or focus on particular issues. This permits the grower to focus time on what needs attention, to save time and preserve yield throughout the season. In one embodiment, seeds and planting instructions 208 are programmed to provide tools for seed selection, hybrid placement, and script creation, including variable rate (VR) script creation, based upon scientific models and empirical data. This enables growers to maximize yield or return on investment through optimized seed purchase, placement and population.

In one embodiment, script generation instructions 205 are programmed to provide an interface for generating scripts, including variable rate (VR) fertility scripts. The interface enables growers to create scripts for field implements, such as nutrient applications, planting, and irrigation. For example, a planting script interface may comprise tools for identifying a type of seed for planting. Upon receiving a selection of the seed type, mobile computer application 200 may display one or more fields broken into management zones, such as the field map data layers created as part of digital map book instructions 206. In one embodiment, the management zones comprise soil zones along with a panel identifying each soil zone and a soil name, texture, drainage for each zone, or other field data. Mobile computer application 200 may also display tools for editing or creating such, such as graphical tools for drawing management zones, such as soil zones, over a map of one or more fields. Planting procedures may be applied to all management zones or different planting procedures may be applied to different subsets of management zones. When a script is created, mobile computer application 200 may make the script available for download in a format readable by an application controller, such as an archived or compressed format. Additionally, and/or alternatively, a script may be sent directly to cab computer 115 from mobile computer application 200 and/or uploaded to one or more data servers and stored for further use.

In one embodiment, nitrogen instructions 210 are programmed to provide tools to inform nitrogen decisions by visualizing the availability of nitrogen to crops. This enables growers to maximize yield or return on investment through optimized nitrogen application during the season. Example programmed functions include displaying images such as SSURGO images to enable drawing of application zones and/or images generated from subfield soil data, such as data obtained from sensors, at a high spatial resolution (as fine as 10 meters or smaller because of their proximity to the soil); upload of existing grower-defined zones; providing an application graph and/or a map to enable tuning application(s) of nitrogen across multiple zones; output of scripts to drive machinery; tools for mass data entry and adjustment; and/or maps for data visualization, among others. "Mass data entry," in this context, may mean entering data once and then applying the same data to multiple fields that have been defined in the system; example data may include nitrogen application data that is the same for many fields of the same grower, but such mass data entry applies to the entry of any type of field data into the mobile computer application 200. For example, nitrogen instructions 210 may be programmed to accept definitions of nitrogen planting and practices programs and to accept user input specifying to apply those programs across multiple fields. "Nitrogen planting programs," in this context, refers to a stored, named set of data that associates: a name, color code or other identifier, one or more dates of application, types of material or product for each of the dates and amounts, method of application or incorporation such as injected or knifed in, and/or amounts or rates of application for each of the dates, crop or hybrid that is the subject of the application, among others. "Nitrogen practices programs," in this context, refers to a stored, named set of data that associates: a practices name; a previous crop; a tillage system; a date of primarily tillage; one or more previous tillage systems that were used; one or more indicators of application type, such as manure, that were used. Nitrogen instructions 210 also may be programmed to generate and cause displaying a nitrogen graph, which indicates projections of plant use of the specified nitrogen and whether a surplus or shortfall is predicted; in some embodiments, different color indicators may signal a magnitude of surplus or magnitude of shortfall. In one embodiment, a nitrogen graph comprises a graphical display in a computer display device comprising a plurality of rows, each row associated with and identifying a field; data specifying what crop is planted in the field, the field size, the field location, and a graphic representation of the field perimeter; in each row, a timeline by month with graphic indicators specifying each nitrogen application and amount at points correlated to month names; and numeric and/or colored indicators of surplus or shortfall, in which color indicates magnitude.

In one embodiment, the nitrogen graph may include one or more user input features, such as dials or slider bars, to dynamically change the nitrogen planting and practices programs so that a user may optimize his nitrogen graph. The user may then use his optimized nitrogen graph and the related nitrogen planting and practices programs to implement one or more scripts, including variable rate (VR) fertility scripts. Nitrogen instructions 210 also may be programmed to generate and cause displaying a nitrogen map, which indicates projections of plant use of the specified nitrogen and whether a surplus or shortfall is predicted; in some embodiments, different color indicators may signal a magnitude of surplus or magnitude of shortfall. The nitrogen map may display projections of plant use of the specified nitrogen and whether a surplus or shortfall is predicted for different times in the past and the future (such as daily, weekly, monthly or yearly) using numeric and/or colored indicators of surplus or shortfall, in which color indicates magnitude. In one embodiment, the nitrogen map may include one or more user input features, such as dials or slider bars, to dynamically change the nitrogen planting and practices programs so that a user may optimize his nitrogen map, such as to obtain a preferred amount of surplus to shortfall. The user may then use his optimized nitrogen map and the related nitrogen planting and practices programs to implement one or more scripts, including variable rate (VR) fertility scripts. In other embodiments, similar instructions to the nitrogen instructions 210 could be used for application of other nutrients (such as phosphorus and potassium) application of pesticide, and irrigation programs.

In one embodiment, weather instructions 212 are programmed to provide field-specific recent weather data and forecasted weather information. This enables growers to save time and have an efficient integrated display with respect to daily operational decisions.

In one embodiment, field health instructions 214 are programmed to provide timely remote sensing images highlighting in-season crop variation and potential concerns. Example programmed functions include cloud checking, to identify possible clouds or cloud shadows; determining nitrogen indices based on field images; graphical visualization of scouting layers, including, for example, those related to field health, and viewing and/or sharing of scouting notes; and/or downloading satellite images from multiple sources and prioritizing the images for the grower, among others.

In one embodiment, performance instructions 216 are programmed to provide reports, analysis, and insight tools using on-farm data for evaluation, insights and decisions. This enables the grower to seek improved outcomes for the next year through fact-based conclusions about why return on investment was at prior levels, and insight into yield-limiting factors. The performance instructions 216 may be programmed to communicate via the network(s) 109 to back-end analytics programs executed at agricultural intelligence computer system 130 and/or external data server computer 108 and configured to analyze metrics such as yield, hybrid, population, SSURGO, soil tests, or elevation, among others. Programmed reports and analysis may include yield variability analysis, benchmarking of yield and other metrics against other growers based on anonymized data collected from many growers, or data for seeds and planting, among others.

Applications having instructions configured in this way may be implemented for different computing device platforms while retaining the same general user interface appearance. For example, the mobile application may be programmed for execution on tablets, smartphones, or server computers that are accessed using browsers at client computers. Further, the mobile application as configured for tablet computers or smartphones may provide a full app experience or a cab app experience that is suitable for the display and processing capabilities of cab computer 115. For example, referring now to view (b) of FIG. 2, in one embodiment a cab computer application 220 may comprise maps-cab instructions 222, remote view instructions 224, data collect and transfer instructions 226, machine alerts instructions 228, script transfer instructions 230, and scouting-cab instructions 232. The code base for the instructions of view (b) may be the same as for view (a) and executables implementing the code may be programmed to detect the type of platform on which they are executing and to expose, through a graphical user interface, only those functions that are appropriate to a cab platform or full platform. This approach enables the system to recognize the distinctly different user experience that is appropriate for an in-cab environment and the different technology environment of the cab. The maps-cab instructions 222 may be programmed to provide map views of fields, farms or regions that are useful in directing machine operation. The remote view instructions 224 may be programmed to turn on, manage, and provide views of machine activity in real-time or near real-time to other computing devices connected to the system 130 via wireless networks, wired connectors or adapters, and the like. The data collect and transfer instructions 226 may be programmed to turn on, manage, and provide transfer of data collected at sensors and controllers to the system 130 via wireless networks, wired connectors or adapters, and the like. The machine alerts instructions 228 may be programmed to detect issues with operations of the machine or tools that are associated with the cab and generate operator alerts. The script transfer instructions 230 may be configured to transfer in scripts of instructions that are configured to direct machine operations or the collection of data. The scouting-cab instructions 230 may be programmed to display location-based alerts and information received from the system 130 based on the location of the agricultural apparatus 111 or sensors 112 in the field and ingest, manage, and provide transfer of location-based scouting observations to the system 130 based on the location of the agricultural apparatus 111 or sensors 112 in the field.

2.3. Data Ingest to the Computer System

In an embodiment, external data server computer 108 stores external data 110, including soil data representing soil composition for the one or more fields and weather data representing temperature and precipitation on the one or more fields. The weather data may include past and present weather data as well as forecasts for future weather data. In an embodiment, external data server computer 108 comprises a plurality of servers hosted by different entities. For example, a first server may contain soil composition data while a second server may include weather data. Additionally, soil composition data may be stored in multiple servers. For example, one server may store data representing percentage of sand, silt, and clay in the soil while a second server may store data representing percentage of organic matter (OM) in the soil.

In an embodiment, remote sensor 112 comprises one or more sensors that are programmed or configured to produce one or more observations. Remote sensor 112 may be aerial sensors, such as satellites, vehicle sensors, planting equipment sensors, tillage sensors, fertilizer or insecticide application sensors, harvester sensors, and any other implement capable of receiving data from the one or more fields. In an embodiment, application controller 114 is programmed or configured to receive instructions from agricultural intelligence computer system 130. Application controller 114 may also be programmed or configured to control an operating parameter of an agricultural vehicle or implement. For example, an application controller may be programmed or configured to control an operating parameter of a vehicle, such as a tractor, planting equipment, tillage equipment, fertilizer or insecticide equipment, harvester equipment, or other farm implements such as a water valve. Other embodiments may use any combination of sensors and controllers, of which the following are merely selected examples.

The system 130 may obtain or ingest data under user 102 control, on a mass basis from a large number of growers who have contributed data to a shared database system. This form of obtaining data may be termed "manual data ingest" as one or more user-controlled computer operations are requested or triggered to obtain data for use by the system 130. As an example, the CLIMATE FIELDVIEW application, commercially available from The Climate Corporation, San Francisco, Calif., may be operated to export data to system 130 for storing in the repository 160.

For example, seed monitor systems can both control planter apparatus components and obtain planting data, including signals from seed sensors via a signal harness that comprises a CAN backbone and point-to-point connections for registration and/or diagnostics. Seed monitor systems can be programmed or configured to display seed spacing, population and other information to the user via the cab computer 115 or other devices within the system 130. Examples are disclosed in U.S. Pat. No. 8,738,243 and US Pat. Pub. 20150094916, and the present disclosure assumes knowledge of those other patent disclosures.

Likewise, yield monitor systems may contain yield sensors for harvester apparatus that send yield measurement data to the cab computer 115 or other devices within the system 130. Yield monitor systems may utilize one or more remote sensors 112 to obtain grain moisture measurements in a combine or other harvester and transmit these measurements to the user via the cab computer 115 or other devices within the system 130.

In an embodiment, examples of sensors 112 that may be used with any moving vehicle or apparatus of the type described elsewhere herein include kinematic sensors and position sensors. Kinematic sensors may comprise any of speed sensors such as radar or wheel speed sensors, accelerometers, or gyros. Position sensors may comprise GPS receivers or transceivers, or WiFi-based position or mapping apps that are programmed to determine location based upon nearby WiFi hotspots, among others.

In an embodiment, examples of sensors 112 that may be used with tractors or other moving vehicles include engine speed sensors, fuel consumption sensors, area counters or distance counters that interact with GPS or radar signals, PTO (power take-off) speed sensors, tractor hydraulics sensors configured to detect hydraulics parameters such as pressure or flow, and/or and hydraulic pump speed, wheel speed sensors or wheel slippage sensors. In an embodiment, examples of controllers 114 that may be used with tractors include hydraulic directional controllers, pressure controllers, and/or flow controllers; hydraulic pump speed controllers; speed controllers or governors; hitch position controllers; or wheel position controllers provide automatic steering.

In an embodiment, examples of sensors 112 that may be used with seed planting equipment such as planters, drills, or air seeders include seed sensors, which may be optical, electromagnetic, or impact sensors; downforce sensors such as load pins, load cells, pressure sensors; soil property sensors such as reflectivity sensors, moisture sensors, electrical conductivity sensors, optical residue sensors, or temperature sensors; component operating criteria sensors such as planting depth sensors, downforce cylinder pressure sensors, seed disc speed sensors, seed drive motor encoders, seed conveyor system speed sensors, or vacuum level sensors; or pesticide application sensors such as optical or other electromagnetic sensors, or impact sensors. In an embodiment, examples of controllers 114 that may be used with such seed planting equipment include: toolbar fold controllers, such as controllers for valves associated with hydraulic cylinders; downforce controllers, such as controllers for valves associated with pneumatic cylinders, airbags, or hydraulic cylinders, and programmed for applying downforce to individual row units or an entire planter frame; planting depth controllers, such as linear actuators; metering controllers, such as electric seed meter drive motors, hydraulic seed meter drive motors, or swath control clutches; hybrid selection controllers, such as seed meter drive motors, or other actuators programmed for selectively allowing or preventing seed or an air-seed mixture from delivering seed to or from seed meters or central bulk hoppers; metering controllers, such as electric seed meter drive motors, or hydraulic seed meter drive motors; seed conveyor system controllers, such as controllers for a belt seed delivery conveyor motor; marker controllers, such as a controller for a pneumatic or hydraulic actuator; or pesticide application rate controllers, such as metering drive controllers, orifice size or position controllers.

In an embodiment, examples of sensors 112 that may be used with tillage equipment include position sensors for tools such as shanks or discs; tool position sensors for such tools that are configured to detect depth, gang angle, or lateral spacing; downforce sensors; or draft force sensors. In an embodiment, examples of controllers 114 that may be used with tillage equipment include downforce controllers or tool position controllers, such as controllers configured to control tool depth, gang angle, or lateral spacing.

In an embodiment, examples of sensors 112 that may be used in relation to apparatus for applying fertilizer, insecticide, fungicide and the like, such as on-planter starter fertilizer systems, subsoil fertilizer applicators, or fertilizer sprayers, include: fluid system criteria sensors, such as flow sensors or pressure sensors; sensors indicating which spray head valves or fluid line valves are open; sensors associated with tanks, such as fill level sensors; sectional or system-wide supply line sensors, or row-specific supply line sensors; or kinematic sensors such as accelerometers disposed on sprayer booms. In an embodiment, examples of controllers 114 that may be used with such apparatus include pump speed controllers; valve controllers that are programmed to control pressure, flow, direction, PWM and the like; or position actuators, such as for boom height, subsoiler depth, or boom position.

In an embodiment, examples of sensors 112 that may be used with harvesters include yield monitors, such as impact plate strain gauges or position sensors, capacitive flow sensors, load sensors, weight sensors, or torque sensors associated with elevators or augers, or optical or other electromagnetic grain height sensors; grain moisture sensors, such as capacitive sensors; grain loss sensors, including impact, optical, or capacitive sensors; header operating criteria sensors such as header height, header type, deck plate gap, feeder speed, and reel speed sensors; separator operating criteria sensors, such as concave clearance, rotor speed, shoe clearance, or chaffer clearance sensors; auger sensors for position, operation, or speed; or engine speed sensors. In an embodiment, examples of controllers 114 that may be used with harvesters include header operating criteria controllers for elements such as header height, header type, deck plate gap, feeder speed, or reel speed; separator operating criteria controllers for features such as concave clearance, rotor speed, shoe clearance, or chaffer clearance; or controllers for auger position, operation, or speed.

In an embodiment, examples of sensors 112 that may be used with grain carts include weight sensors, or sensors for auger position, operation, or speed. In an embodiment, examples of controllers 114 that may be used with grain carts include controllers for auger position, operation, or speed.

In an embodiment, examples of sensors 112 and controllers 114 may be installed in unmanned aerial vehicle (UAV) apparatus or "drones." Such sensors may include cameras with detectors effective for any range of the electromagnetic spectrum including visible light, infrared, ultraviolet, near-infrared (NIR), and the like; accelerometers; altimeters; temperature sensors; humidity sensors; pitot tube sensors or other airspeed or wind velocity sensors; battery life sensors; or radar emitters and reflected radar energy detection apparatus. Such controllers may include guidance or motor control apparatus, control surface controllers, camera controllers, or controllers programmed to turn on, operate, obtain data from, manage and configure any of the foregoing sensors. Examples are disclosed in U.S. patent application Ser. No. 14/831,165 and the present disclosure assumes knowledge of that other patent disclosure.

In an embodiment, sensors 112 and controllers 114 may be affixed to soil sampling and measurement apparatus that is configured or programmed to sample soil and perform soil chemistry tests, soil moisture tests, and other tests pertaining to soil. For example, the apparatus disclosed in U.S. Pat. Nos. 8,767,194 and 8,712,148 may be used, and the present disclosure assumes knowledge of those patent disclosures.

In an embodiment, sensors 112 and controllers 114 may comprise weather devices for monitoring weather conditions of fields. For example, the apparatus disclosed in U.S. Provisional Application No. 62/154,207, filed on Apr. 29, 2015, U.S. Provisional Application No. 62/175,160, filed on Jun. 12, 2015, U.S. Provisional Application No. 62/198,060, filed on Jul. 28, 2015, and U.S. Provisional Application No. 62/220,852, filed on Sep. 18, 2015, may be used, and the present disclosure assumes knowledge of those patent disclosures.

2.4 Process Overview—Agronomic Model Training

In an embodiment, the agricultural intelligence computer system 130 is programmed or configured to create an agronomic model. In this context, an agronomic model is a data structure in memory of the agricultural intelligence computer system 130 that comprises field data 106, such as identification data and harvest data for one or more fields. The agronomic model may also comprise calculated agronomic properties which describe either conditions which may affect the growth of one or more crops on a field, or properties of the one or more crops, or both. Additionally, an agronomic model may comprise recommendations based on agronomic factors such as crop recommendations, irrigation recommendations, planting recommendations, and harvesting recommendations. The agronomic factors may also be used to estimate one or more crop related results, such as agronomic yield. The agronomic yield of a crop is an estimate of quantity of the crop that is produced, or in some examples the revenue or profit obtained from the produced crop.

In an embodiment, the agricultural intelligence computer system 130 may use a preconfigured agronomic model to calculate agronomic properties related to currently received location and crop information for one or more fields. The preconfigured agronomic model is based upon previously processed field data, including but not limited to, identification data, harvest data, fertilizer data, and weather data. The preconfigured agronomic model may have been cross validated to ensure accuracy of the model. Cross validation may include comparison to ground truthing that compares predicted results with actual results on a field, such as a comparison of precipitation estimate with a rain gauge or sensor providing weather data at the same or nearby location or an estimate of nitrogen content with a soil sample measurement.

Figure 3:
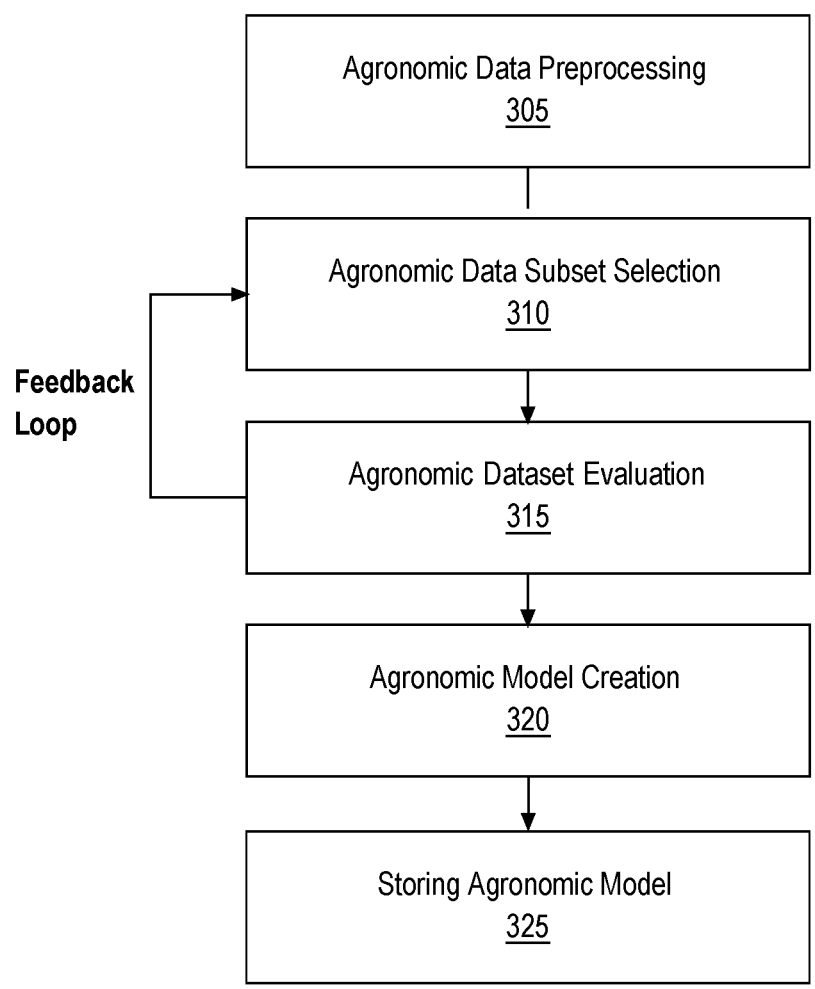
FIG. 3 illustrates a programmed process by which the agricultural intelligence computer system generates one or more preconfigured agronomic models using agronomic data provided by one or more data sources.

FIG. 3 illustrates a programmed process by which the agricultural intelligence computer system generates one or more preconfigured agronomic models using field data provided by one or more data sources. FIG. 3 may serve as an algorithm or instructions for programming the functional elements of the agricultural intelligence computer system 130 to perform the operations that are now described.

At block 305, the agricultural intelligence computer system 130 is configured or programmed to implement agronomic data preprocessing of field data received from one or more data sources. The field data received from one or more data sources may be preprocessed for the purpose of removing noise and distorting effects within the agronomic data including measured outliers that would bias received field data values. Embodiments of agronomic data preprocessing may include, but are not limited to, removing data values commonly associated with outlier data values, specific measured data points that are known to unnecessarily skew other data values, data smoothing techniques used to remove or reduce additive or multiplicative effects from noise, and other filtering or data derivation techniques used to provide clear distinctions between positive and negative data inputs.

At block 310, the agricultural intelligence computer system 130 is configured or programmed to perform data subset selection using the preprocessed field data in order to identify datasets useful for initial agronomic model generation. The agricultural intelligence computer system 130 may implement data subset selection techniques including, but not limited to, a genetic algorithm method, an all subset models method, a sequential search method, a stepwise regression method, a particle swarm optimization method, and an ant colony optimization method. For example, a genetic algorithm selection technique uses an adaptive heuristic search algorithm, based on evolutionary principles of natural selection and genetics, to determine and evaluate datasets within the preprocessed agronomic data.

At block 315, the agricultural intelligence computer system 130 is configured or programmed to implement field dataset evaluation. In an embodiment, a specific field dataset is evaluated by creating an agronomic model and using specific quality thresholds for the created agronomic model. Agronomic models may be compared using cross validation techniques including, but not limited to, root mean square error of leave-one-out cross validation (RMSECV), mean absolute error, and mean percentage error. For example, RMSECV can cross validate agronomic models by comparing predicted agronomic property values created by the agronomic model against historical agronomic property values collected and analyzed. In an embodiment, the agronomic dataset evaluation logic is used as a feedback loop where agronomic datasets that do not meet configured quality thresholds are used during future data subset selection steps (block 310).

At block 320, the agricultural intelligence computer system 130 is configured or programmed to implement agronomic model creation based upon the cross validated agronomic datasets. In an embodiment, agronomic model creation may implement multivariate regression techniques to create preconfigured agronomic data models.

At block 325, the agricultural intelligence computer system 130 is configured or programmed to store the preconfigured agronomic data models for future field data evaluation.

2.5 Location Selection for Treatment Sampling

In some embodiments, the server 170 comprises a region assignment component 172, a location selection module 174, and a client interface 176. In some embodiments, the field data preparation component 178 is programmed to prepare data that describes agricultural conditions at locations of interest within a field. The data can include measurable data, such as the SOM level or soil pH value, and derived data, such as CSIs. The region assignment component 172 is programmed to assign known treatments to treatment polygons to maximize the coverage of design parameter values for each of the known treatments across the treatment polygons. The location selection module 174 is programmed to select locations within treatment polygons to which a known treatment has been assigned to maximize the coverage of design parameter values for the known treatment across the selected locations. The client interface 176 is programmed to communicate with a client computer, such as the field manager computing device 104 or the cab computer 115, over a communication network. The communication can include receiving input data, such as definitions of treatment polygons or a desired number of samples for each treatment, and transmitting output data, such as information regarding selected locations for treatment sampling.

FIG. 1 illustrates examples only and the agricultural intelligence computer system 130 and the client computer can comprise fewer or more functional or storage components. Each of the functional components can be implemented as software components, general or specific-purpose hardware components, firmware components, or any combination thereof. A storage component can be implemented using any of relational databases, object databases, flat file systems, or JSON stores. A storage component can be connected to the functional components locally or through the networks using programmatic calls, remote procedure call (RPC) facilities or a messaging bus. A component may or may not be self-contained. Depending upon implementation-specific or other considerations, the components may be centralized or distributed functionally or physically. Some of the components that reside in the server in these examples can reside in a client computer, and vice versa.

2.6 Implementation Example—Hardware Overview

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

For example, FIG. 4 is a block diagram that illustrates a computer system 400 upon which an embodiment of the invention may be implemented. Computer system 400 includes a bus 402 or other communication mechanism for communicating information, and a hardware processor 404 coupled with bus 402 for processing information. Hardware processor 404 may be, for example, a general purpose microprocessor.

Computer system 400 also includes a main memory 406, such as a random access memory (RAM) or other dynamic storage device, coupled to bus 402 for storing information and instructions to be executed by processor 404. Main memory 406 also may be used for storing temporary variables or other intermediate information during execution of instructions to be executed by processor 404. Such instructions, when stored in non-transitory storage media accessible to processor 404, render computer system 400 into a special-purpose machine that is customized to perform the operations specified in the instructions.

Computer system 400 further includes a read only memory (ROM) 408 or other static storage device coupled to bus 402 for storing static information and instructions for processor 404. A storage device 410, such as a magnetic disk, optical disk, or solid-state drive is provided and coupled to bus 402 for storing information and instructions.

Computer system 400 may be coupled via bus 402 to a display 412, such as a cathode ray tube (CRT), for displaying information to a computer user. An input device 414, including alphanumeric and other keys, is coupled to bus 402 for communicating information and command selections to processor 404. Another type of user input device is cursor control 416, such as a mouse, a trackball, or cursor direction keys for communicating direction information and command selections to processor 404 and for controlling cursor movement on display 412. This input device typically has two degrees of freedom in two axes, a first axis (e.g., x) and a second axis (e.g., y), that allows the device to specify positions in a plane.

Computer system 400 may implement the techniques described herein using customized hard-wired logic, one or more ASICs or FPGAs, firmware and/or program logic which in combination with the computer system causes or programs computer system 400 to be a special-purpose machine. According to one embodiment, the techniques herein are performed by computer system 400 in response to processor 404 executing one or more sequences of one or more instructions contained in main memory 406. Such instructions may be read into main memory 406 from another storage medium, such as storage device 410. Execution of the sequences of instructions contained in main memory 406 causes processor 404 to perform the process steps described herein. In alternative embodiments, hard-wired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical disks, magnetic disks, or solid-state drives, such as storage device 410. Volatile media includes dynamic memory, such as main memory 406. Common forms of storage media include, for example, a floppy disk, a flexible disk, hard disk, solid-state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 402. Transmission media can also take the form of acoustic or light waves, such as those generated during radio-wave and infra-red data communications.

Various forms of media may be involved in carrying one or more sequences of one or more instructions to processor 404 for execution. For example, the instructions may initially be carried on a magnetic disk or solid-state drive of a remote computer. The remote computer can load the instructions into its dynamic memory and send the instructions over a telephone line using a modem. A modem local to computer system 400 can receive the data on the telephone line and use an infra-red transmitter to convert the data to an infra-red signal. An infra-red detector can receive the data carried in the infra-red signal and appropriate circuitry can place the data on bus 402. Bus 402 carries the data to main memory 406, from which processor 404 retrieves and executes the instructions. The instructions received by main memory 406 may optionally be stored on storage device 410 either before or after execution by processor 404.

Computer system 400 also includes a communication interface 418 coupled to bus 402. Communication interface 418 provides a two-way data communication coupling to a network link 420 that is connected to a local network 422. For example, communication interface 418 may be an integrated services digital network (ISDN) card, cable modem, satellite modem, or a modem to provide a data communication connection to a corresponding type of telephone line. As another example, communication interface 418 may be a local area network (LAN) card to provide a data communication connection to a compatible LAN. Wireless links may also be implemented. In any such implementation, communication interface 418 sends and receives electrical, electromagnetic or optical signals that carry digital data streams representing various types of information.

Network link 420 typically provides data communication through one or more networks to other data devices. For example, network link 420 may provide a connection through local network 422 to a host computer 424 or to data equipment operated by an Internet Service Provider (ISP) 426. ISP 426 in turn provides data communication services through the world wide packet data communication network now commonly referred to as the "Internet" 428. Local network 422 and Internet 428 both use electrical, electromagnetic or optical signals that carry digital data streams. The signals through the various networks and the signals on network link 420 and through communication interface 418, which carry the digital data to and from computer system 400, are example forms of transmission media.

Computer system 400 can send messages and receive data, including program code, through the network(s), network link 420 and communication interface 418. In the Internet example, a server 430 might transmit a requested code for an application program through Internet 428, ISP 426, local network 422 and communication interface 418.

The received code may be executed by processor 404 as it is received, and/or stored in storage device 410, or other non-volatile storage for later execution.

3. Functional Description

In some embodiments, the treatment sampling server 170 is programmed or configured with data structures and/or database records that are arranged to receive one or more of the following items as input data: a number of desired treatments, a number of samples for each treatment, a list of treatment polygons, a list of design parameters with their global ranges and relative sensitivities, a number of categories into which the global range of one of the design parameters can be divided, a map including design parameter values associated with a list of locations, a width of a buffer area around each treatment polygon, and a minimum distance between adjacent sampling points.

In some embodiments, the server 170 is programmed to produce one or more of the following items as output data: a list of treatment assignments for the treatment polygons, a set of sampling locations, and a set of sampling probabilities computed for sampling locations assigned to the same treatment.

3.1 Generating Field Data

Figure 7:
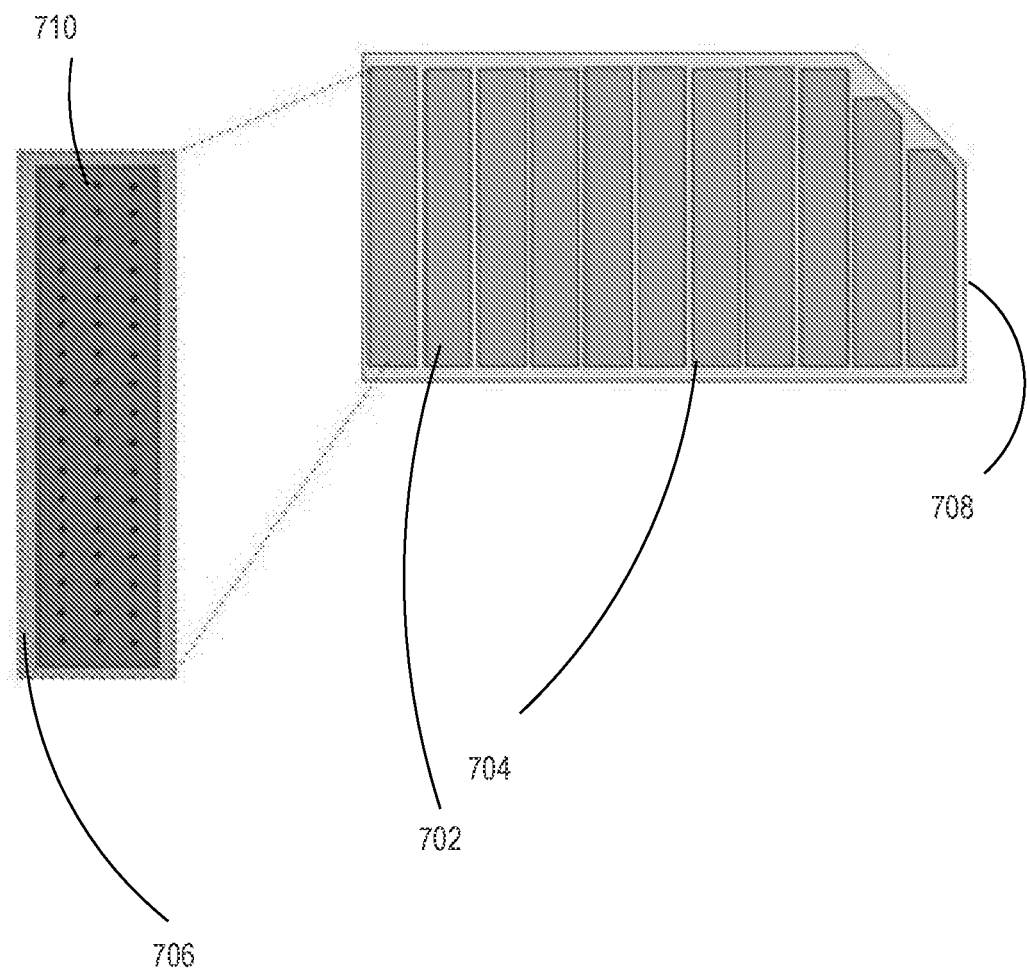
FIG. 7 illustrates an example layout of a field.

FIG. 7 illustrates an example layout of a field. In some embodiments, the field 708 can comprise a number of treatment polygons, such as the treatment polygon 702. The field may contain a field-level buffer area 704, where a planter or another machine makes a turn. The frequent traffic makes the field-level buffer 704 unsuitable for data collection. Each treatment polygon may also contain a regional buffer area, such as the peripheral area 706. A regional buffer area generally identifies the sides of a treatment polygon that can be contaminated by treatments in neighboring treatment polygons or may often be reserved for specific grower experiments, such as adjusted seeding rates. Therefore, a regional buffer area is generally not suited for systematic sampling. Given a list of treatment polygons that do not overlap with the field-level buffer area 704 and the width of the regional buffer area for each treatment polygon, the server can be programmed to refine each treatment polygon by removing the regional buffer area from consideration. The width of a regional buffer area can vary among different treatment polygons or even among different ends of a single treatment polygon.

In some embodiments, the server 170 is programmed to define a sampling area in the field and delineates sampling areas within each treatment polygon, such as the sampling areas 710. The size or shape of a sampling area can be determined based on how a soil sample is collected or how a soil treatment is applied. For example, a soil sample is typically not collected at a point but by mixing cores obtained from a circular sample area. The radius of such a circular sample area may then dictate the size of a sampling area, which in turn determines the distance between two sampling locations. For example, the size of a sampling area can be set to be larger than substantially one or more than one of such circular sample area.

In some embodiments, a given map may include no set of design parameter values for a delineated sampling area (a "non-covered sampling area") or at least one set of design parameter values for a delineated sampling area (a "covered sampling area"). When more than one set of design parameter values are available for a sampling area, the server can be programmed to determine one set of design parameter values from a selection or an aggregation of the more than one set of design parameter values. For a non-covered sampling area, the server can be programmed to determine one set of design parameter values based on the sets of design parameter values included by the map or previously determined. For example, the determination can be a selection of the set of design parameter values for the nearest covered sampling area. When the global range of a design parameter is continuous, the determination can be an interpolation or extrapolation from the sets of design parameter values for nearby sampling areas. A sampling area for which a set of design parameter values is included in the map or determined by the server will be referred to as a candidate sampling location hereinafter.

In some embodiments, the server 170 is programmed to compute a CSI for each candidate sampling location. Given a list of design parameters with their global ranges and relative sensitivities as well as a number of categories into which the global range of one of the design parameters can be divided, the server is programmed to create a number of strata over the combination of design parameters. The server is configured to first determine a number of categories into which the global range can be divided for each design parameter having continuous values. With the number of categories for a first design parameter available, the server is programmed to compute the number of categories for a second design parameter based on the relative sensitivities of the two design parameters such that a higher sensitivity leads to a larger number of categories. For example, the list of design parameters can include the SOM level and the soil pH value. When the number of categories for the SOM level is 20 and the relative sensitivities of the SOM level and the soil pH value are respectively 1 and 0.32, the number of categories for the soil pH value can be set to 20*0.32 or approximately 7.

In some embodiments, the server 170 is configured to evenly distribute the values of a design parameter in its global range to the determined number of categories. For example, the global range for the SOM level can be between 0% and 10%, and the global range for the soil pH value can be 3-9, and an even assignment into 7 categories would result in the first category covering 3 to and including 4, the second category covering more than 4 to and including 5, and so on. When all the global ranges have been divided into categories, the server is then configured to form a stratum from each combination of categories, one category for each design parameter, with the total number of strata being the product of the numbers of categories for all the design parameters.

In some embodiments, the server 170 is programmed then to designate the CSI for each candidate sampling location as the combination of category indices defined by the set of design parameter values for the candidate sampling location. For example, when the SOM level for a candidate sampling location is 0.8%, the category index for the SOM level for this candidate sampling location can be 2 out of 20 indices from 1 to 20. Similarly, when the soil pH value for the candidate sampling location is 5.5, the category index for the soil pH value for this candidate sampling location can be 3 out of 7 indices from 1 to 7. Thus, the CSI for this candidate sampling location can be represented as $SOM_2pH_3$. Generally, the larger the number of unique CSIs is for the candidate sampling locations in a field, the more variable the field is considered to be.

In some embodiments, the server 170 can be configured to take the number of categories for more than one design parameters as input data. Instead of relative sensitivities, the server can be configured to take other relative indicators for determining the numbers of categories, such as relative importance values. The server can be further configured to determine the number of categories or assign the values in the global range into a determined number of categories for a design parameter based on the global range for the design parameter or the distribution of values in the global range. As one example, the server can be configured to compute a histogram for the values and define the scope of each category based on a category size threshold. As another example, the server can be configured to classify the global range into local ranges of respective significance values and assign the values in more significant local ranges into more categories. A significance value can reflect a degree of correlation with another design parameter, for example. Furthermore, the number of categories for different design parameters and ultimately the number of possible strata can be determined based on the given number of sampling locations. It can be desirable for the number of possible strata to be close to the given number of sampling locations, for example.

3.2 Distributing Treatment Polygons to Treatments

Figure 8:
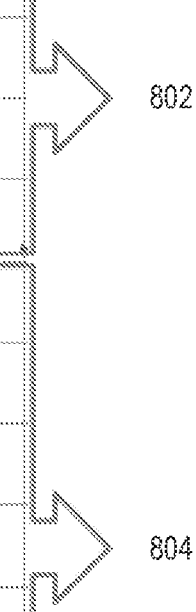
FIG. 8 illustrates an example process of distributing treatment polygons to a given number of treatments.

FIG. 8 illustrates an example process of distributing treatment polygons to a given number of treatments. In some embodiments, the server 170 is programmed to distribute the treatment polygons to the given number of treatments, or in other words to assign one of the treatments to each of the treatment polygons. Initially, the server 170 is programmed to sort the treatment polygons by the number of unique CSIs computed for the candidate sampling locations in each treatment polygon. In FIG. 8, each row of the table corresponds to a treatment polygon, and the columns correspond to the treatment polygon index, the number of associated unique CSIs, the row index, and the treatment assignment. The rows are sorted in a descending order of the number of unique CSIs. In step 802, the server is programmed to assign the given number of treatments to the most varied treatment polygons, namely those associated with the largest number of unique CSIs. Therefore, the four given treatments can be assigned to the top four treatment polygons.

In some embodiments, the distribution or assignment in the first round can be random in nature or, when the treatments have different significance values, a more significant treatment can be assigned to a more varied treatment polygon, for example. Each treatment can also be assigned to multiple treatment polygons that have not yet received treatment assignments (the "unassigned treatment polygons") at once. In addition, step 802 can be repeated one or more times on the unassigned treatment polygons.

In some embodiments, in step 804, the server 170 is programmed to further assign the treatments to the unassigned treatment polygons. In some embodiments, the selection of a treatment can be random in nature. The selection can also give priority to a treatment having the smallest number of unique CSIs associated with the treatment polygons to which the treatment is already assigned. Alternatively, the assignments can be performed in successive rounds with each of the given treatments assigned exactly once in each round; the order of selection in the current round can be the reverse of the order of selection in the previous round, or can be the same as or different from the order of selection in the previous round or all the previous rounds. For example, reversing the order of selection in the previous round, where the fourth treatment, the second treatment, the first treatment, and the third treatment were assigned in that order as shown in FIG. 8, the server can be configured to initially select the third treatment in the current round.

In some embodiments, the server 170 is configured to select one of the treatments, identify an unassigned treatment polygon that has the least number of unique CSIs in common with the combination of treatment polygons to which the selected treatment is already assigned, and assign the selected treatment to the identified treatment polygon, with the goal of maximizing the number of unique CSIs associated with the treatment polygons to which each treatment is ultimately assigned. In the end, while no two treatments would share a treatment polygon, two treatments can share one or more CSIs as different treatment polygons may be associated with the same CSI.

In some embodiments, for each treatment, the server 170 can also be configured to identify multiple unassigned treatment polygons that have the least number of unique CSIs in common with the combination of treatment polygons to which the selected treatment is already assigned and assign the selected treatment to one of the identified treatment polygons at random or two or more of them at once. In addition, the server can be programmed to identify one or more unassigned treatment polygons associated with the most number of unique CSIs that are different from the unique CSIs associated with the combination of treatment polygons to which the selected treatment is already assigned, or that have a smallest percentage of unique CSIs in common with the combination of treatment polygons.

3.3 Selecting Treatment Locations within Treatment Polygons

In some embodiments, for each treatment, the server 170 is programmed to select a given number n of sampling locations from the candidate sampling locations in the treatment polygons to which the treatment has been assigned (the "treatment-specific treatment polygons"), with the goal of maximizing the number of unique CSIs for the selected sampling locations. The given number n of sampling locations can be smaller than the number M of all possible strata or even the number m of strata with which at least one candidate sampling locations in the treatment-specific treatment polygons is associated (the "non-empty strata"). M also equals number of possible unique CSIs, and m also equals the number of unique CSIs associated with the treatment-specific treatment polygons. Thus, the server is programmed to initially select n of the non-empty strata. It is preferred that for a design parameter of a higher value of relative sensitivity or relative importance, more categories of the design parameter are covered by the n selected strata. For example, the server can be configured to ensure that a larger number of categories for a more important design parameter are covered by the n selected strata.

In some embodiments, for each selected stratum, the server 170 is programmed to select one of the candidate sampling locations in the treatment-specific treatment polygons associated with the stratum. The selection can be random in nature or subject to various constraints. For example, priority may be given to a candidate sampling location that is closer to the center of a treatment polygon, or a candidate sampling location having a design parameter value in a certain category.

In some embodiments, the server 170 is configured to compute a probability of selection for each selected sampling location. In the case where for each treatment the server randomly selects n of the non-empty strata and then for each selected stratum the server randomly selects one of the candidate sampling locations, the probability that point i is selected, namely the probability that Ri equals 1 given the set of design parameter values $\vec{V}_i$, is computed as follows:

$$Prob(R_i = 1 \mid \vec{V}_i) = \frac{n}{m} \frac{1}{N_k}, \text{ when } \vec{V}_i \in V_k \text{ and } N_k \neq 0; 0, \text{ when } \vec{V}_i \in V_k$$

$$\text{and } N_k = 0$$

where $V_k$ denotes the set of all candidate sampling points that belong to the kth strata, $N_k$ denotes the sample size for the kth stratum or the size of $V_k$, and k=1, 2, . . . , M. The sampling probabilities can be unequal across the candidate sampling locations.

In some embodiments, the server 170 is configured to transmit information regarding the selected sampling locations, the corresponding treatment assignments, or the computed probabilities of selection to a display device or a remote client computer. For example, for each selected sampling location, the information can include the geographical coordinate, the size, the identity of the enclosing treatment polygon, the treatment assignment, the probability of selection, or the distance to the boundary of the enclosing treatment polygon.

3.4 Example Data and Processes

Another example of applying the approaches herein for selecting locations for treatment sampling is given as follows. In this example, the treatments are nitrogen trials of four treatment levels, and for each treatment level eight sampling locations are chosen. The chosen design parameters are the SOM level, the CEC, the pH value, and relative elevation. Their relative sensitivities are 1, 0.8, 0.6, and 0.4 respectively. The global ranges are 0.5% to 8% for the SOM level, 3 to 30 for the CEC, 4 to 8 for the pH value, and 0 to 15 for relative elevation. The number of treatments is four, and the number of samples for each treatment is eight. The minimum distance between two candidate sampling locations is 6.5 meters. A first field ("field 11") contains 21 treatment polygons and a second field ("field 6") contains 47 treatment polygons. The method of this disclosure is applied to different fields separately.

First, the treatment polygons within one of the fields are distributed to the four treatments. FIG. 9 illustrates an example comparison in treatment assignment between output of the treatment sampling server and output of a random assignment technique. In this example, the approach of the present disclosure is applied to field 6. In FIG. 9, to the right of the header column, the first through the fourth columns correspond to the four treatments, the fifth column indicates the mean of the values in the first fourth columns, and the sixth column indicates the variance of the values in the first fourth columns. Below the header row, the first row indicates the number of unique CSIs covered by the server, the second row indicates the number of unique CSIs covered by the random method, and the third row indicates a range for the number of unique CSIs covered by the random method in 100 iterations. The table shows that the server tends to produce a treatment assignment that assigns unique CSIs evenly across different treatments and covers more unique CSIs for individual treatments than the random method.

Figure 10:
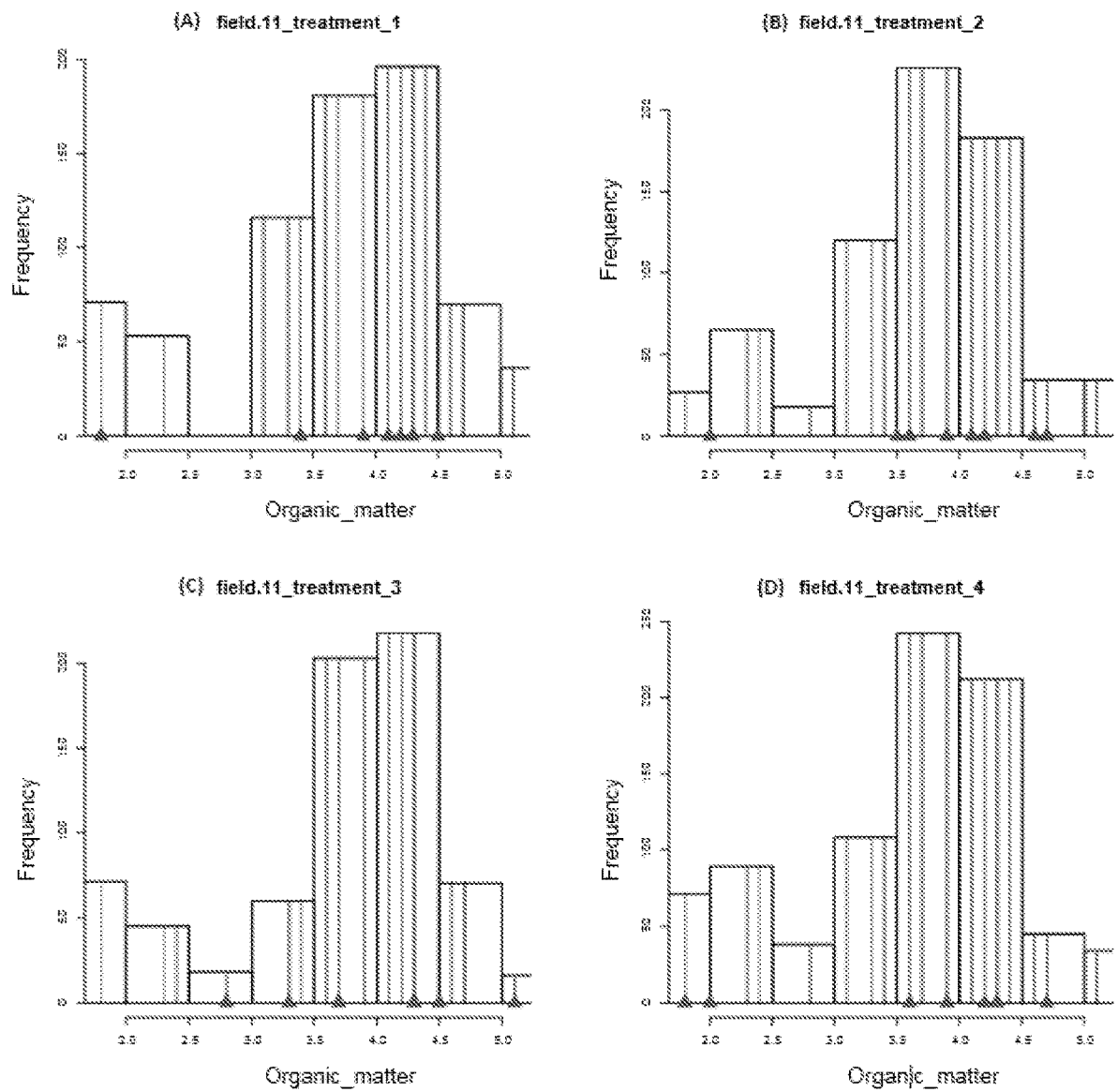
FIG. 10 illustrates an overview of sample locations selected by the treatment sampling server with respect to candidate sampling locations.

Next, for each of the four treatments, eight strata are selected from the non-empty strata associated with the treatment-specific treatment polygons, and for each of the eight selected strata, a candidate sampling location is selected from the candidate sampling locations associated with the stratum in the treatment-specific treatment polygons. FIG. 10 illustrates an overview of sample locations selected by the treatment sampling server with respect to candidate sampling locations. In this example, the approaches of the present disclosure are applied to field 11, and the outcome is shown for the SOM level for the four treatments respectively in FIG. 10A, FIG. 10B, FIG. 10C, and FIG. 10D. In each of these figures, the x-axis represents the SOM level while the y-axis represents the distribution of the different SOM levels for each treatment-specific treatment polygons. The vertical bars correspond to the candidate sampling locations in the treatment-specific treatment polygons. The triangles correspond to the selected sampling locations, which might appear less than eight as some sampling locations might have identical SOM values and thus some triangles overlap in the figures. These figures show that the selected sampling locations cover a good range of the SOM levels.

Figure 11:
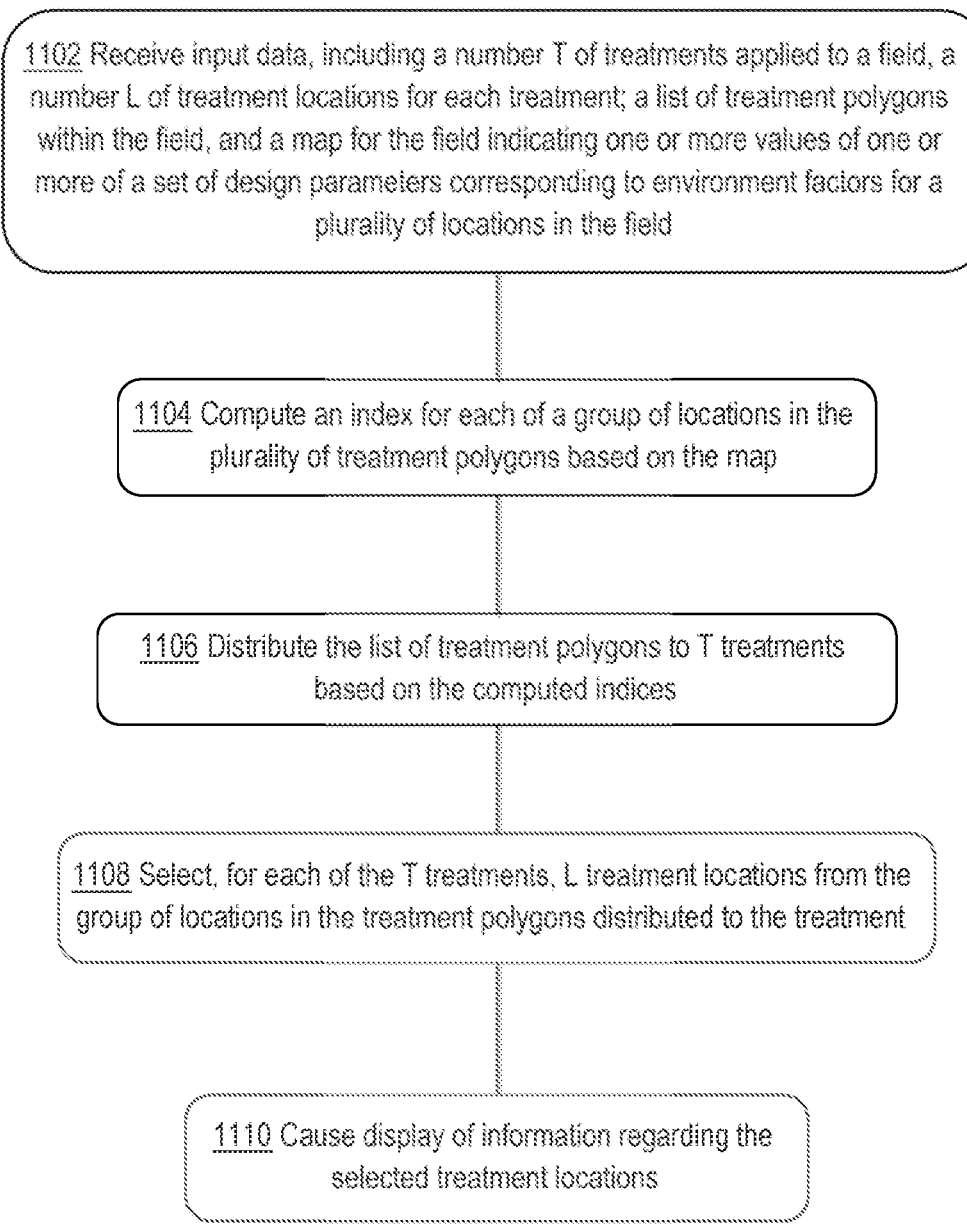
FIG. 11 illustrates an example process performed by the treatment sampling server of selecting locations for treatment sampling.

FIG. 11 illustrates an example process performed by the treatment sampling server of selecting locations for treatment sampling. In some embodiments, in step 1102, the server 170 is configured to receive input data, which can include a number T of treatments applied to a field, a number L of desired treatment locations or sampling locations for each treatment, a list of treatment polygons within the field, and a map for the field indicating one or more values of one or more of a set of design parameters corresponding to environment factors for a plurality of locations in the field. A treatment can be a nitrogen trial, and different treatments can correspond to applying different levels of nitrate to the soil. A design parameter can be a soil parameter, such as a pH value, or a topography parameter, such as an elevation relative to a base level. The server can be configured to refine the treatment polygons by removing buffer regions from consideration.

In some embodiments, the server 170 can also be configured to define sampling areas. The server can be further configured to determine a set of design parameter values for the sampling areas in the treatment polygons based on the map, increasing the resolution of the map through interpolation from those sets of design parameter values, for example.

In some embodiments, in step 1104, the server 170 is programmed to compute a CSI for each of the group of candidate sampling locations, namely the sampling areas in the treatment polygons for which sets of design parameters values are determined. The server can be configured to first divide the global range for each design parameter into a number of categories. The number of categories or the manner of division can be determined by a user specification or by a derivation from user-supplied values. For example, a user can supply the number of categories for the most sensitive design parameter, namely the one whose unit change is likely to have a most significant effect on the outcome of interest, and sensitivities of other design parameters relative to the most sensitive design parameter. The number of categories for a specific design parameter can then be determined by adjusting the number of categories for the most sensitive design parameter with the relative sensitivity of the specific design parameter to the most sensitive design parameter. For each candidate sampling location, the server can then be configured to determine in which categories the corresponding set of design parameter values belong and identify the combination of categories as the CSI, which also corresponds to one of the possible strata.

In some embodiments, in step 1106, the server 170 is programmed to distribute the list of treatment polygons to the T treatments based on the computed CSIs. The server can be configured to perform the distribution in rounds, assigning in each round each of the treatments to the unassigned treatment polygon having the smallest number of unique CSIs in common with the treatment polygons already distributed to the treatment. The server can be configured to perform the distribution in other manners with the goal to maximize the number of unique CSIs associated with the treatment polygons distributed to a single treatment.

In some embodiments, in step 1108, the server 170 is programmed to select, for each of the T treatments, L sampling locations from the candidate sampling locations in the treatment-specific treatment polygons. The server can be configured to first randomly select L strata from all the non-empty strata associated with the treatment-specific treatment polygons. In other words, the server can be configured to first randomly select L unique CSIs out of all the unique CSIs associated with the treatment-specific treatment polygons. The server can be configured to next randomly select, for each of the selected stratum, one candidate sampling location from all candidate sampling selections associated with the stratum. The server can be further configured to compute a probability of selection for each of the selected sampling location.

In some embodiments, in step 1110, the server 170 is programmed to transmit information regarding each of the selected sampling locations to a display device or a remote client computer. The information can include, for each selected sampling location, the geographical coordinate, the size, the index of the enclosing treatment polygon, the treatment assignment, or the CSI.

What is claimed is:

1. A computer-implemented method of selecting locations in a field for treatment sampling, comprising:
   receiving, by a processor, input data including:
      a number T of treatments applied to a field,
      a number L of treatment locations for each treatment,
      a list of treatment polygons within the field, and
      a map for the field indicating one or more values of a set of design parameters corresponding to environment factors affecting treatments to the field for each of a plurality of locations in the field;
   computing, by the processor, an environment class index for each of a group of locations in the list of treatment polygons based on the corresponding one or more values of the set of design parameters;
   distributing the list of treatment polygons to the T treatments based on the computed environment class indices;
   selecting, for each of the T of treatments, L treatment locations from the group of locations in the treatment polygons distributed to the treatment;
   causing display of information regarding the selected treatment locations.

2. The computer-implemented method of claim 1, one of the T treatments being a nitrogen fertilizer trial.

3. The computer-implemented method of claim 1, the set of design parameters including a soil parameter or a topography parameter.

4. The computer-implemented method of claim 1, further comprising:
   determining a number of categories for each of the set of design parameters,
   computing an environment class index comprising identifying a category for each of the set of design parameters from the corresponding number of categories based on one or more values of the set of design parameters for the location in the map.

5. The computer-implemented method of claim 4, further comprising:
   the input data further including a set of relative sensitivity values corresponding to the set of design parameters,
   the determining being based on the set of relative sensitivity values, such that a larger relative sensitivity value corresponds to a larger number of categories.

6. The computer-implemented method of claim 1, the distributing comprising:
   calculating a number of unique environment class indices computed for the group of locations in each of the plurality of treatment polygons;
   assigning T of the list of treatment polygons having largest numbers of unique environment class indices respectively to the T treatments.

7. The computer-implemented method of claim 6, the distributing further comprising assigning one of the list of treatment polygons that have not been assigned to any of the T treatments to one of the T treatments, the one treatment polygon sharing a smallest number of unique environment class indices with the list of treatment polygons that have been assigned to the one treatment.

8. The computer-implemented method of claim 6, selecting L treatment locations comprising:
   selecting a random L of the number of unique environment class indices computed for the group of locations in the treatment polygon;
   for each of the L selected environment class indices, selecting a random one of the group of locations in the treatment polygon having the selected environment class index.

9. The computer-implemented method of claim 8, further comprising
   determining the group of locations by expanding the plurality of locations,
   the input further including a minimum distance between two locations;
   any pair of the group of locations being separated by at least the minimum distance.

10. The computer-implemented method of claim 1, the information including a geographical coordinate and a probability of selection for each of the selected locations.

11. A non-transitory computer-readable medium storing one or more instructions which, when executed by one or more processors, cause the one or more processors to perform a method of selecting locations in a field for treatment sampling, the method comprising:
   receiving input data including:
      a number T of treatments applied to a field,
      a number L of treatment locations for each treatment,
      a list of treatment polygons within the field, and
      a map for the field indicating one or more values of a set of design parameters corresponding to environment factors affecting treatments to the field for each of a plurality of locations in the field;
   computing an environment class index for each of a group of locations in the list of treatment polygons based on the corresponding one or more values of the set of design parameters;
   distributing the list of treatment polygons to the T treatments based on the computed environment class indices;
   selecting, for each of the T of treatments, L treatment locations from the group of locations in the treatment polygons distributed to the treatment;
   causing display of information regarding the selected treatment locations.

12. The non-transitory computer-readable medium of claim 11, one of the T treatments being a nitrogen fertilizer trial.

13. The non-transitory computer-readable medium of claim 11, the set of design parameters including a soil parameter or a topography parameter.

14. The non-transitory computer-readable medium of claim 11, the method further comprising
   determining a number of categories for each of the set of design parameters,
   computing an environment class index comprising identifying a category for each of the set of design parameters from the corresponding number of categories based on one or more values of the set of design parameters for the location in the map.

15. The non-transitory computer-readable medium of claim 14, the method further comprising:
   the input data further including a set of relative sensitivity values corresponding to the set of design parameters,
   the determining being based on the set of relative sensitivity values, such that a larger relative sensitivity value corresponds to a larger number of categories.

16. The non-transitory computer-readable medium of claim 11, the distributing comprising:
   calculating a number of unique environment class indices computed for the group of locations in each of the plurality of treatment polygons;

assigning T of the list of treatment polygons having largest numbers of unique environment class indices respectively to the T treatments.

17. The non-transitory computer-readable medium of claim 16, the distributing further comprising assigning one of the list of treatment polygons that have not been assigned to any of the T treatments to one of the T treatments, the one treatment polygon sharing a smallest number of unique environment class indices with the list of treatment polygons that have been assigned to the one treatment.

18. The non-transitory computer-readable medium of claim 16, selecting L treatment locations comprising:
- selecting a random L of the number of unique environment class indices computed for the group of locations in the treatment polygon;
- for each of the L selected environment class indices, selecting a random one of the group of locations in the treatment polygon having the selected environment class index.

19. The non-transitory computer-readable medium of claim 18, the method further comprising
- determining the group of locations by expanding the plurality of locations,
- the input further including a minimum distance between two locations;
- any pair of the group of locations being separated by at least the minimum distance.

20. The non-transitory computer-readable medium of claim 11, the information including a geographical coordinate and a probability of selection for each of the selected locations.

* * * * *